(12) United States Patent
Lee et al.

(10) Patent No.: US 7,821,821 B2
(45) Date of Patent: *Oct. 26, 2010

(54) MULTIBIT ELECTRO-MECHANICAL DEVICE AND METHOD OF MANUFACTURING THE SAME

(75) Inventors: Ji-Myoung Lee, Yongin-si (KR); Min-Sang Kim, Seoul (KR); Eun-Jung Yun, Seoul (KR); Sung-Young Lee, Yongin-si (KR); In-Hyuk Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 3 days.

This patent is subject to a terminal disclaimer.

(21) Appl. No.: 12/154,449

(22) Filed: May 23, 2008

(65) Prior Publication Data

US 2009/0072296 A1 Mar. 19, 2009

(30) Foreign Application Priority Data

May 23, 2007 (KR) .................. 10-2007-0050226

(51) Int. Cl.
*G11C 11/50* (2006.01)
(52) U.S. Cl. .............. 365/164; 365/185.03; 365/185.13
(58) Field of Classification Search .................. 365/164, 365/185.03, 185.13
See application file for complete search history.

(56) References Cited

U.S. PATENT DOCUMENTS

| | | | |
|---|---|---|---|
| 5,774,414 | A | 6/1998 | Melzner et al. |
| 6,054,745 | A | 4/2000 | Nakos et al. |
| 6,100,109 | A | 8/2000 | Melzner et al. |
| 6,473,361 | B1 * | 10/2002 | Chen et al. .................. 365/244 |
| 6,625,047 | B2 * | 9/2003 | Coleman, Jr. ................ 365/51 |
| 6,750,742 | B2 | 6/2004 | Kang et al. |

(Continued)

FOREIGN PATENT DOCUMENTS

JP 200031397 1/2000

(Continued)

OTHER PUBLICATIONS

Decision of Grant, issued Sep. 23, 2008, in related Korean Application No. 10-2007-0050226.

(Continued)

*Primary Examiner*—Pho M Luu
(74) *Attorney, Agent, or Firm*—Mills & Onello, LLP

(57) ABSTRACT

A multibit electro-mechanical memory device and a method of manufacturing the same include a substrate, a bit line in a first direction on the substrate, a lower word line in a second direction intersecting the first direction, a pad electrode isolated from a sidewall of the lower word line and connected to the bit line, a cantilever electrode expending in the first direction over the lower word line with a lower void therebetween, and connected to the pad electrode and curved in a third direction vertical to the first and second direction by an electrical field induced by a charge applied to the lower word line, a trap site expending in the second direction over the cantilever electrode with an upper void therebetween, and an upper word line to which a charge to curve the cantilever electrode in a direction of the trap site is applied, and on the trap site.

7 Claims, 18 Drawing Sheets

U.S. PATENT DOCUMENTS

| | | |
|---|---|---|
| 7,071,023 B2 | 7/2006 | Bertin et al. |
| 7,122,942 B2 | 10/2006 | Song et al. |
| 2005/0037547 A1 | 2/2005 | Bertin et al. |
| 2005/0230271 A1 | 10/2005 | Levon et al. |
| 2005/0279988 A1 | 12/2005 | Bertin |
| 2006/0128046 A1 | 6/2006 | Onishi |
| 2006/0166393 A1 | 7/2006 | Ha et al. |
| 2006/0181630 A1 | 8/2006 | Shioji et al. |
| 2007/0015303 A1 | 1/2007 | Bertin et al. |
| 2008/0048246 A1 | 2/2008 | Yun et al. |
| 2008/0137404 A1 | 6/2008 | Park |
| 2008/0144364 A1 | 6/2008 | Lee et al. |
| 2008/0185668 A1* | 8/2008 | Kim et al. .................... 257/415 |
| 2008/0198649 A1 | 8/2008 | Park |
| 2008/0219048 A1 | 9/2008 | Lee et al. |
| 2009/0053846 A1 | 2/2009 | Rueckes et al. |
| 2009/0072296 A1* | 3/2009 | Lee et al. .................... 257/324 |
| 2009/0072297 A1* | 3/2009 | Lee et al. .................... 257/324 |
| 2009/0097315 A1* | 4/2009 | Yun et al. ............... 365/185.13 |
| 2009/0115009 A1* | 5/2009 | Lee et al. .................... 257/415 |
| 2010/0038731 A1 | 2/2010 | Van Kampen et al. |

FOREIGN PATENT DOCUMENTS

| | | |
|---|---|---|
| JP | 2004-63605 | 2/2004 |
| KR | 1020010032068 | 4/2001 |
| KR | 1020010107918 | 12/2001 |
| KR | 100417481 | 1/2004 |
| KR | 1020040035678 | 4/2004 |
| KR | 100434369 | 5/2004 |
| KR | 100621827 | 1/2006 |
| KR | 10-2006-0085426 | 7/2006 |

OTHER PUBLICATIONS

Decision of Grant issued on Sep. 29, 2008 in related Korean Application No. 10-2007-0050223.

* cited by examiner

MULTIBIT ELECTRO-MECHANICAL DEVICE AND METHOD OF MANUFACTURING THE SAME

CROSS REFERENCE TO RELATED APPLICATIONS

This application claims priority under 35 U.S.C. §119 from Korean Patent Application 10-2007-0050226, filed on May 23, 2007, the contents of which are hereby incorporated by reference in their entirety for all purposes as if fully set forth herein.

FIELD OF THE INVENTION

The present invention relates to semiconductor memory devices and a method of manufacturing the same. More particularly, the present invention relates to a multibit electro-mechanical memory device and a method of manufacturing the same, for programming and reading data through the switching operation of plural cantilever electrodes formed symmetrically relative to a trench.

BACKGROUND OF THE INVENTION

Typically, a memory device that stores data is largely classified as either a volatile semiconductor memory device or a nonvolatile semiconductor memory device. The volatile memory device principally represented as a DRAM (Dynamic Random Access Memory) or an SRAM (Static Random Access Memory) etc. is fast with regard to an input/output operation of data, but has a shortcoming in that stored contents is lost when a power supply is stopped. The nonvolatile memory device principally provided as EPROM (Erasable Programmable Read Only Memory) or EEPROM (Electrically Erasable Programmable Read Only Memory), etc. is slow with regard to the input/output operation of data, but has the benefit of maintaining intact the stored data even when a power supply is interrupted.

A memory device according to such conventional art commonly employs a MOSFET (Metal Oxide Semiconductor Field Effect Transistor) based-memory. For example, a stack gate-type transistor memory device of a stack structure on a semiconductor substrate formed of silicon material, and a trench gate type transistor memory device having a structure buried in the semiconductor substrate, are under development. However, a width and length of channel in the MOSFET must be formed with a sufficient length to suppress a short-channel effect. Further, a thickness of a gate insulation layer formed between a gate electrode formed on the channel and the semiconductor substrate must be extremely thin. Due to this fundamental problem, there is a difficulty to realize a memory device having a nano-level ultra microstructure for the MOSFET.

Memory devices of the structure to replace the MOSFET with new ones are under active research. Recently, micro electro-mechanical system (MEMS) and nano electro-mechanical system (NEMS) technology applied to a suspend bridge memory (SBM) has become an issue. As an example, a nonvolatile memory device using the MEMS technology is disclosed in U.S. Pat. No. 6,054,745, incorporated herein in its entirety by reference.

FIG. 1 is a sectional view schematic showing a conventional memory device.

As shown in FIG. 1, a conventional memory device is obtained by forming an FET (Field Effect Transistor) sensor 221, attractive electrode part 223, and cantilever electrode supporter 225, to be distinguished from one another, on a shallow trench isolation (STI) 224 formed on a substrate 222. A cantilever electrode 240 is further formed of a type such that one side of the cantilever electrode 240 is supported by, and electrically connected to, the cantilever electrode supporter 225, and the cantilever electrode 240 is distanced by a predetermined height from the attractive electrode part 223 and the FET sensor 221. The cantilever electrode 240 is formed so as to be curved toward the attractive electrode 232 by an electric field induced by the attractive electrode part 223. Then, even when the electric field induced by the attractive electrode part 223 is eliminated, the cantilever electrode 240 can maintain its curved state by an electric field generated from captured electrons held by a polysilicon gate electrode 230 of the FET sensor 221. For example, the polysilicon gate electrode 230 corresponds to a floating electrode of a flash memory device, which captures electron tunneled through a tunnel oxide layer that is formed of a dielectric formed on a source-drain region 227 of the FET sensor 221. The attractive electrode part 223 and the cantilever electrode supporter 225 are formed of the same polysilicon material as the polysilicon gate electrode 230. The cantilever electrode 240 is also formed of polysilicon material in the cantilever electrode supporter 225.

That is, in a conventional memory device, a nonvolatile memory device can include an attractive electrode 232 for curving the cantilever electrode 240 due to an electromagnetic force, below the cantilever electrode 240, and an FET sensor 221 for maintaining the curved state of the cantilever electrode 240.

However, a conventional memory device has the following problems.

In the conventional memory device, a cantilever electrode supporter 225 supporting the cantilever electrode 240 and the FET sensor 221 are formed in parallel. Thus it is difficult to arrange a cell array of matrix type and so there is a shortcoming in that an integration of memory devices decreases.

Further, in the conventional memory device, an attractive electrode part 223 causes the cantilever electrode 240 of a horizontal state to be curved, and the FET sensor 221 maintains the curved state of the cantilever electrode 240 that is curved by the attractive electrode part 223. Thus, the attractive electrode part 223 and FET sensor must be configured separately on the same horizontal face, and the cantilever electrode 240 must be sufficiently long to cover the upper part of the attractive electrode part 223 and the FET sensor 221. That is, there is a limitation with regard to a decrease in integration of memory devices.

Further, in the conventional memory device, only 1 bit of data is programmed or read out per one unit cell comprised of the cantilever electrode 240, attractive electrode 232 and FET sensor 221. Thus, it is difficult for the conventional memory device to store multibit data.

SUMMARY OF THE INVENTION

An embodiment of the invention provides a multibit electro-mechanical memory device and method of manufacturing the same, which is capable of increasing at most an integrated level of memory devices by forming, in the same direction, a cantilever electrode and a bit line of applying a charge to the cantilever electrode. Further, the integrated level of memory devices can increase or increase at most by reducing a length of the cantilever electrode and by unifying an attractive electrode contacted with the cantilever electrode and the FET sensor. In addition, data of 2 bits or more for one unit cell can be input/output.

In an aspect, a memory device comprises: a substrate having a flat face; a bit line formed in a first direction on the substrate; a lower word line insulated from the bit line and formed in a second direction intersecting the first direction; a pad electrode electrically isolated from a sidewall of the lower word line and connected to the bit line; a cantilever electrode expending in the first direction, suspended over the lower word line with a lower void therebetween, and connected to the pad electrode, the cantilever electrode curved in a third direction that is vertical with respect to the first and second direction by an electrical field induced by a first charge applied to the lower word line; a trap site expending in the second direction and suspended over the cantilever electrode with an upper void therebetween; and an upper word line to which a charge to curve the cantilever electrode in a direction of the trap site is applied, the upper word line positioned on the trap site.

In an embodiment, the trap site comprises a first silicon oxide layer, trap silicon nitride layer and second silicon oxide layer.

In an embodiment, an interlayer insulating film is formed on a portion of the cantilever electrode overlapping the pad electrode to support the trap site and the upper word line.

In another aspect, a multibit electro-mechanical memory device comprises: a substrate having a flat face; a bit line formed in a first direction on the substrate; a first interlayer insulating film on the bit line, and a trench formed in the first interlayer insulating film, the first interlayer insulating film formed in a second direction intersecting the first direction; first and second lower word lines formed on the first interlayer insulating film; a second interlayer insulating film that covers sides of the first and second lower word lines and sides of the first interlayer insulating film, wherein the first and second lower word lines are separated from each other by being on opposite sides of the trench; a pad electrode in a contact hole of which the bit line is exposed by removing a portion of the second interlayer insulating film provided on sides of the first and second lower word lines; first and second cantilever electrodes supported in the first direction by the pad electrode, the first and second cantilever electrodes above an upper part of the first and second lower word lines, and suspended above first and second lower voids, and separated by the trench, and curved in a third direction vertical to the first and second direction by an electrical field induced by a first charge applied to the first and second lower word lines; a third interlayer insulating film formed on the first and second cantilever electrodes corresponding to the pad electrode; first and second trap sites supported by the third interlayer insulating film and formed in the second direction, with first and second upper voids above an upper part of the first and second cantilever electrodes; and first and second upper word lines stacked on the first and second trap sites, to which a second charge is applied to curve the first and second cantilever electrodes in a direction of the first and second trap sites.

In an embodiment, the pad electrode is protruded more than a length of the second interlayer insulating film.

In an embodiment, the first and second trap sites have a stack structure of first silicon oxide layer, silicon nitride layer and second silicon oxide layer.

In an embodiment, a fourth interlayer insulating film is formed to seal the trench at an upper part of the trench.

In another aspect, a method of manufacturing a multibit electro-mechanical memory device comprises: forming a bit line in a first direction on a substrate; forming a first interlayer insulating film and a lower word line in a second direction intersecting the bit line; forming a second interlayer insulating film covering sidewalls of the first interlayer insulating film and the lower word line; forming a first sacrifice layer on the second interlayer insulating film and the lower word line; forming a contact hole to which the bit line is exposed selectively, by removing the first sacrifice layer and the second interlayer insulating film; forming a pad electrode inside the contact hole; forming a cantilever electrode in the first direction on the pad electrode and the first sacrifice layer; forming a second sacrifice layer, trap site and upper word line in the second direction; forming a third interlayer insulating film covering sidewalls of the second sacrifice layer, the trap site and the upper word line; removing, in the second direction, the upper word line, the trap site, the second sacrifice layer, the cantilever electrode, the first sacrifice layer and the lower word line, and thus forming a trench for exposing the first interlayer insulating film from the bottom thereof; and removing the first and second sacrifice layers exposed to the trench and then forming voids in upper and lower parts of the cantilever electrode.

In an embodiment, the second interlayer insulating film is formed including forming a silicon oxide layer burying the lower word line and removing the silicon oxide layer to be planarized so as to expose the lower word line.

In an embodiment, the pad electrode is formed by forming conductive metal filling in the contact hole and by removing the conductive metal to be planarized so as to expose the lower word line.

In an embodiment, the method further comprises forming titanium or titanium nitride layer on the bit line exposed to the contact hole before forming the pad electrode.

In an embodiment, when the first and second sacrifice layers are formed of polysilicon material, the polysilicon material is isotropically etched and removed through a wet or dry etching method.

In an embodiment, isotropical etchant solution used for the wet etching method contains mixture solution is obtained by mixing the nitric acid, HF and acetic acid with deionized water by a given density, and isotropical reactive gas used for the dry etching method contains gas of fluoridation carbon group comprised of $CF_4$ or $CHF_3$.

In an embodiment, the method further comprises forming a fourth interlayer insulating film shielding an upper end of the trench so as to seal up the trench.

BRIEF DESCRIPTION OF THE DRAWINGS

The above and other features and advantages of the present invention will become more apparent to those of ordinary skill in the art by describing in detail preferred embodiments thereof with reference to the attached drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE INVENTION

The present invention now will be described more fully hereinafter with reference to FIGS. 2 to 18, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 18. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

The thickness of several layers and regions shown referring to the accompanied drawings are just for the clarity in the description of the invention. In addition, in the following description referred to as "existing/adapted/formed 'on' a layer or substrate," it may indicate that it directly contacts the other layer or substrate or that a third layer is interposed therebetween.

Figure 1:
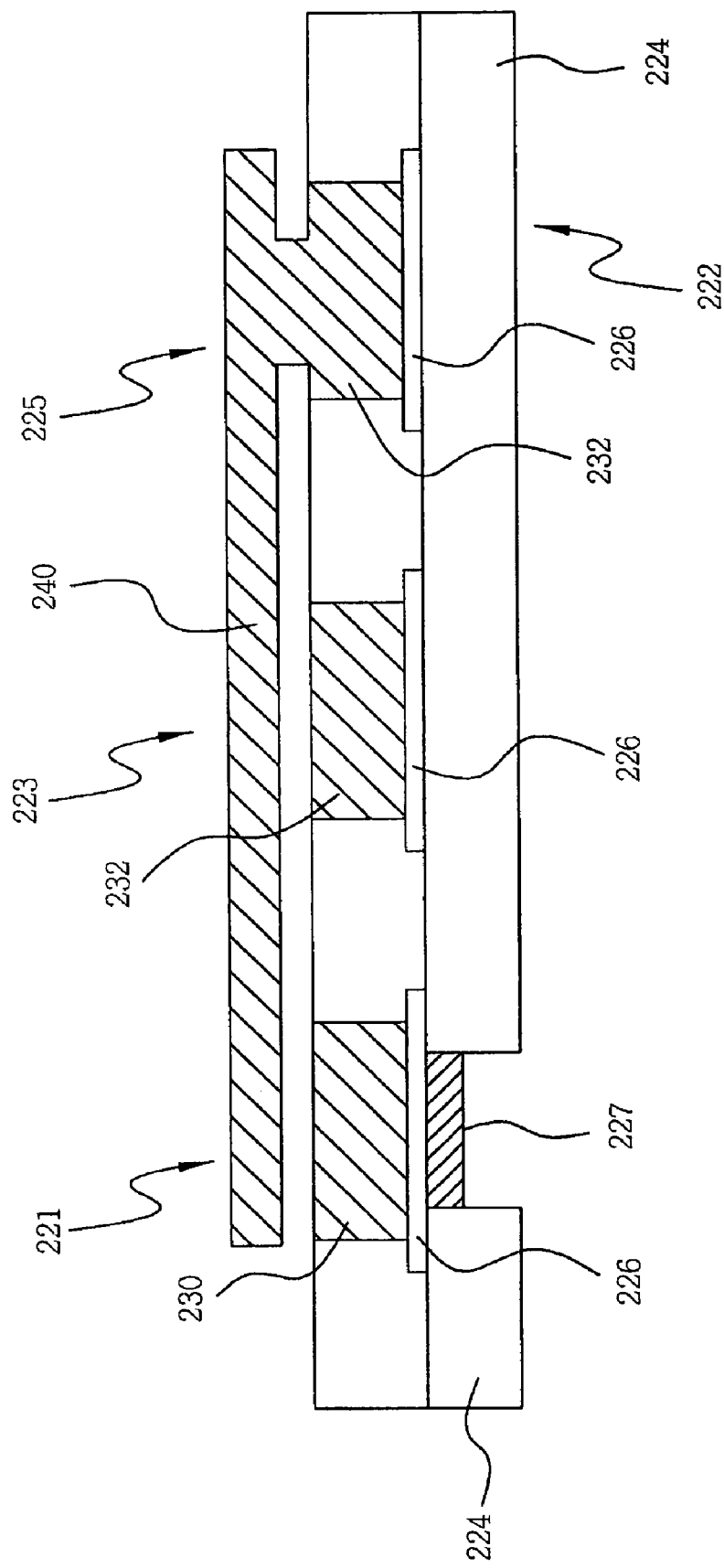
FIG. 1 is a sectional view schematic illustrating a conventional memory device.
Figure 2:
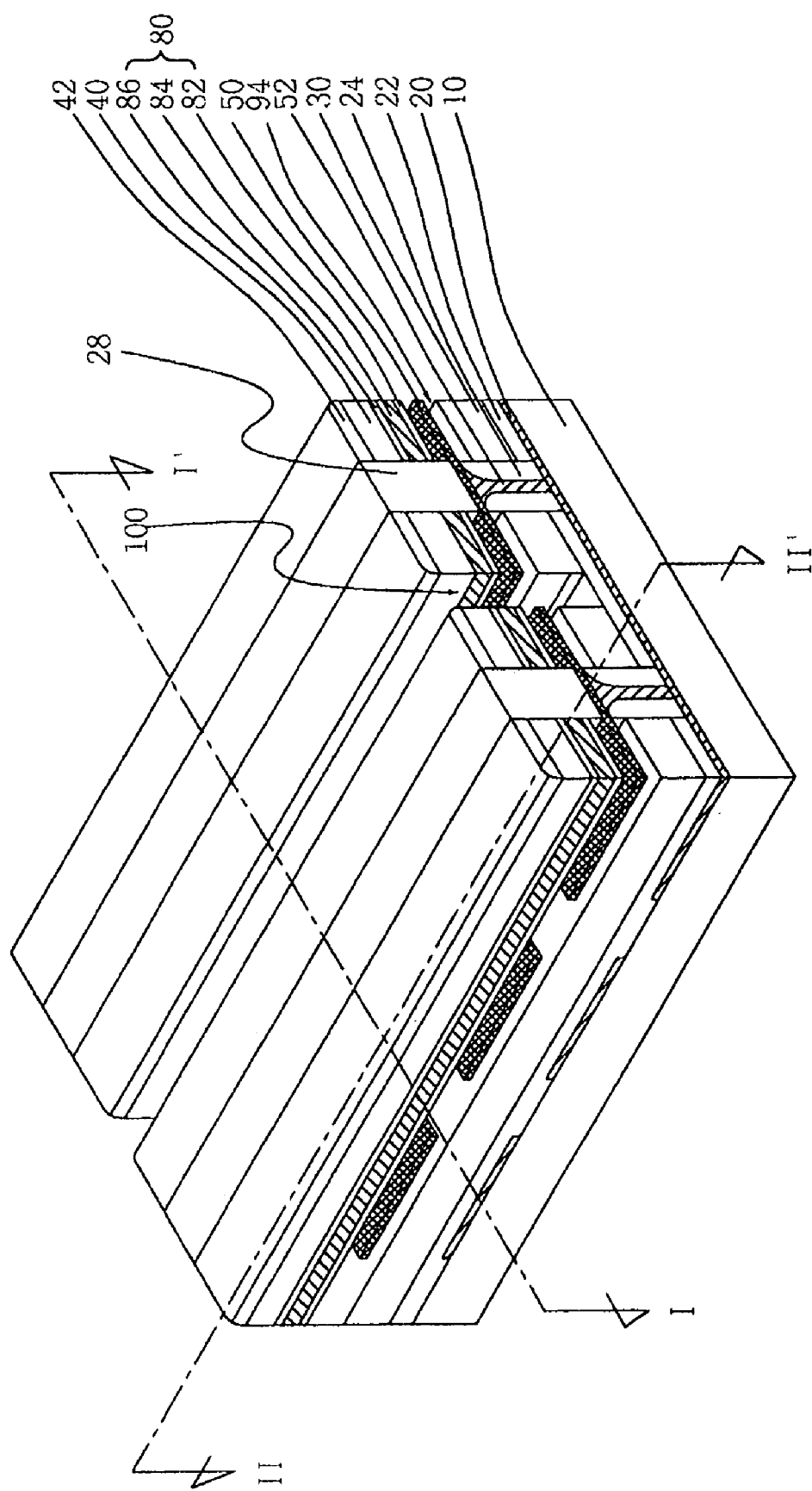
FIG. 2 is a perspective view showing a multibit electro-mechanical memory device according to an embodiment of the invention.
Figure 3:
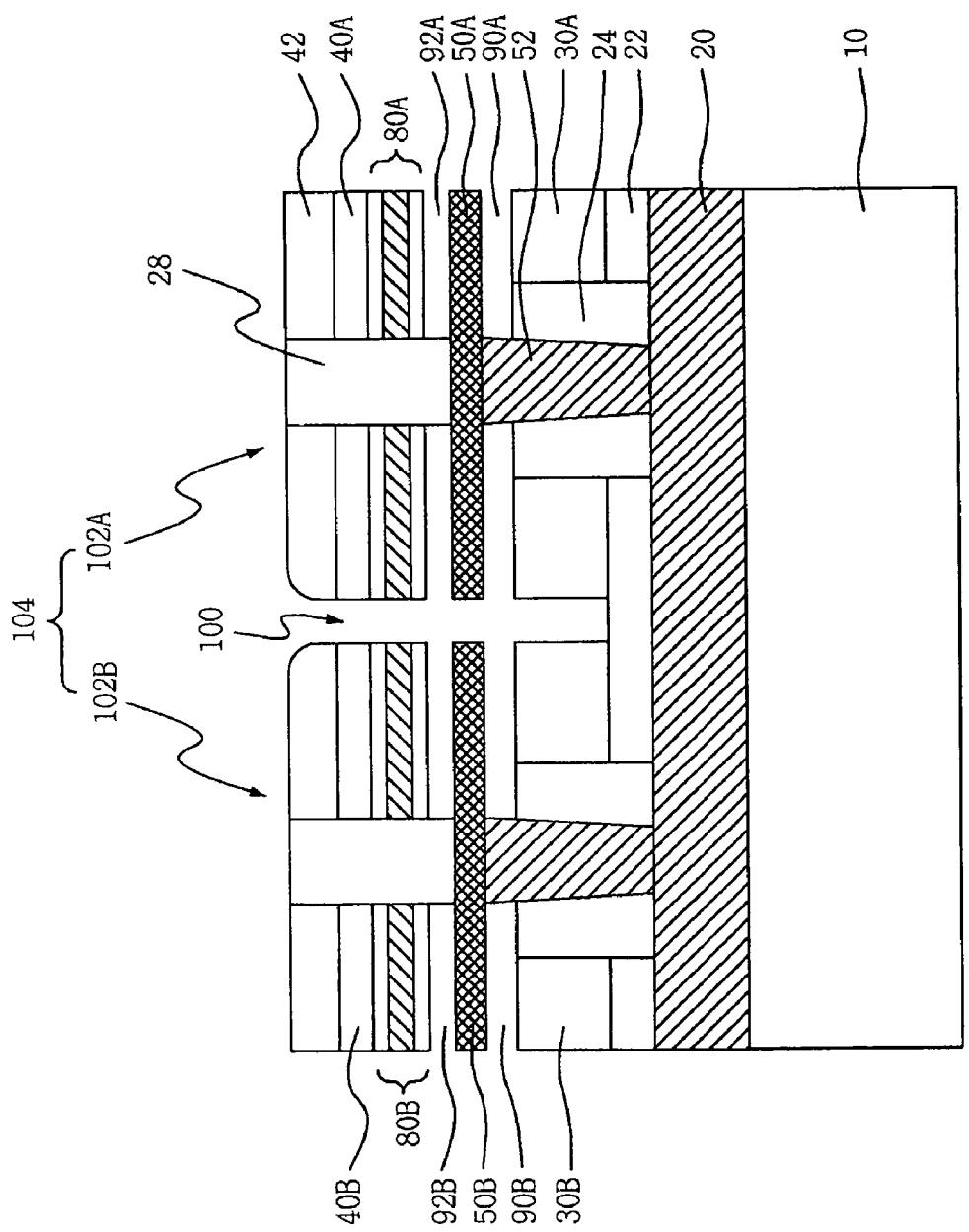
FIG. 3 is a sectional view taken along a line I~I' of FIG. 2.

FIG. 2 is a perspective view showing a multibit electro-mechanical memory device according to an embodiment of the invention. FIG. 3 is a sectional view taken along a line I~I' of FIG. 2.

Referring to FIGS. 2 and 3, a plurality of bit lines 20 are formed in a first direction on a predefined flat face of a substrate 10. For example, the substrate 10 is formed including an insulation substrate or semiconductor substrate having a certain degree of flexibility. The plurality of bit lines 20 are formed including at least one of conductive metal material, and crystal silicon or polysilicon material doped with conductive impurity, the conductive metal material including at least one of gold, silver, copper, aluminum, tungsten, tungsten silicide, titanium, titanium nitride, tantalum, tantalum silicide, or other conductive material metals known to those of skill in the art. A first interlayer insulating film 22 is formed on the plurality of bit lines 20. For example, the first interlayer insulating film 22 is a dielectric of electrically insulating the bit line 20, and is formed containing silicon oxide or silicon oxide nitride.

First lower word line 30A and a second lower word line 30B are horizontally separated from each other by a trench 100, and are formed in the second direction on the first interlayer insulating film 22. The first lower word line 30A and the second lower word line 30B are insulated from the substrate 10 and the plurality of bit lines 20 by the first interlayer insulating film 22. Thus, an electric signal can be applied thereto freely from the bit lines. For example, the first and second lower word lines 30A and 30B may be formed of prominent conductive metal material, i.e., gold, silver, copper, aluminum, tungsten, tungsten silicide, titanium, titanium nitride, tantalum, tantalum silicide, or other conductive metal materials known to those of skill in the art, similar to materials of the bit line 20.

A second interlayer insulating film 24 is formed in the second direction to electrically insulate between the first lower word line 30A and the second lower word line 30B. In an embodiment, the second interlayer insulating film covers a first sidewall of the first and second lower word lines 30A that is opposite a second sidewall of the first and second lower word lines 30A and 30B that is exposed by the trench 100. The second interlayer insulating film 24 may be formed to have the same as or similar height to the first and second lower word lines 30A and 30B. In an embodiment, the second interlayer insulating film 24 may be formed containing silicon oxide, silicon nitride or silicon oxide nitride.

Although not shown in FIGS. 2-3, a portion of the second interlayer insulating film 24 is removed, thereby forming a contact hole (54 of FIG. 12A) to which the bit line 20 is exposed, in the center of the second interlayer insulating film 24 between sidewalls of two lower word lines. A plurality of lower word lines 30 are formed on the substrate with some layers interposed therebetween. Each of the plurality of lower word lines is separated to two sections by a trench. One of the two sections is referred to a first word line 30A and the other is referred to a second word line 30B. The contact hole 54 may be formed by selectively removing the second interlayer insulating film 24 formed on the bit line 20 from a mutual intersection portion of the second interlayer insulating film 24 formed in a second direction and the bit line 20 formed in a first direction. A pad electrode 52 electrically connected to the bit line 20 is formed in the contact hole 54. The pad electrode 52 is formed to project higher than not only an inside height of the contact hole 54 but also a level of the first and second lower word lines 30A and 30B. The pad electrode 52 may be insulated by the second interlayer insulating film 24 from the first and second lower word lines 30A and 30B. For example, the pad electrode 52 is formed including at least one of conductive metal material having a prominent conduction, and crystal silicon or polysilicon material doped with conductive impurity, like the bit line 20, the conductive metal material being at least one of gold, silver, copper, aluminum, tungsten, tungsten silicide, titanium, titanium nitride, tantalum, tantalum silicide or other conductive metal materials known to those of skill in the art.

A first cantilever electrode 50A and a second cantilever electrode 50B are formed in a first direction, i.e., X-axis direction, such that the pad electrode 52 is interposed therebetween, the first and second cantilever electrodes 50A and 50B are suspended over first and second lower voids 90A and 90B, which are formed on the first and second lower word lines 30A and 30B. The first and second cantilever electrodes 50A and 50B are supported by the pad electrode 52. Referring to FIG. 2, a cantilever electrode 50 is supported by one pad electrode. In FIG. 3, two cantilever electrodes 50 are shown and each cantilever electrode is divided into two dependent parts, One of the two parts on the left side of a corresponding pad electrode is referred to as a first cantilever electrode 50A and the other one on the right side of the corresponding pad electrode is referred to as a second cantilever electrode 50B. In a multibit electro-mechanical memory device according to an embodiment of the invention, first and second lower word lines 30A and 30B are formed in a second direction intersecting the bit line 20 in the upper part of the bit line 20 formed in the first direction, and cantilever electrodes 50A, 50B are formed in the same first direction as the bit line 20, with first and second lower voids 90A and 90B formed on the first and second lower word lines 30A and 30B, thereby configuring a cell array of matrix type and so increasing an integrated level.

The first and second cantilever electrodes 50A and 50B may be curved in a direction of the first and second lower word lines 30A and 30B by an electrostatic force resulting from an electric field that is induced in the first and second lower voids 90A and 90B. That is, when a predefined amount of charge having mutually different polarities is applied between the first and second cantilever electrodes 50A and 50B and the first and second lower word lines 30A and 30B, the first and second cantilever electrodes 50A and 50B may be curved in a third direction, i.e., Z-axis direction, by an electrostatic force corresponding to an attractive force. For example, the first and second cantilever electrodes 50A and 50B may be formed of titanium, titanium nitride, or carbon nanotube material. The titanium and the titanium nitride are not easily oxidized even though exposed to air through the first and second lower voids 90A and 90B, and are not transformed despite having a given level of curvature state, as such conductive metals have an elastic force greater than a plasticity/elasticity coefficient. The carbon nanotube has a tube shape comprising six-sided shapes each constructed of 6 carbon atoms are associated with one another, and a diameter of the tube ranges from several through tens of nanometers, hence the term "carbon nanotube." Additionally, in the carbon nanotube, an electrical conduction is similar to that of copper, and heat conduction is similar to that of diamond, which is most prominent therefor in the natural world, and which has a stiffness that is prominent more by 100 times than that of steel. Carbon fiber is cut against the transformation of even 1%, but carbon nanotube has a restoring force to endure against the transformation of 15%.

Above the first and second cantilever electrodes 50A and 50B, first and second trap sites 80A and 80B are formed in the second direction positioned above upper voids 92A, 92B, and having a height of first and second upper voids 92A and 92B from the first and second cantilever electrodes 50A and 50B, and first and second upper word lines 40A and 40B are also formed in the second direction. The first trap site 80A is separated from the second trap site 80B, and the first upper word line 40A is separated from the second upper word line 40B, by the trench 100. In the first and second trap sites 80A and 80B, a given amount of charge is applied through the first and second upper word lines 40A and 40B, and is tunneled and trapped inside thereof. As a result, the trapped charge can be always held even when there is no charge applied from the outside. For example, the first and second trap sites 80A and 80B are formed including an ONO (Oxide-Nitride-Oxide) structure such that a first silicon oxide 82, silicon nitride 84, and second silicon oxide 86 are stacked above the first and second upper voids 92A and 92B. For example, the first and second upper word lines 40A and 40B may be formed of prominent conductive metal material, i.e., gold, silver, copper, aluminum, tungsten, tungsten silicide, titanium, titanium nitride, tantalum, tantalum silicide, or other conductive metal materials known to one of skill in the art, like the first and second lower word lines 30A and 30B.

On the other hand, when a predefined charge is applied to the first and second upper word lines 40A and 40B, the charge can be tunneled and captured by the first and second trap sites 80A and 80B. Then, the first and second cantilever electrodes 50A and 50B are curved upward so that the tip of the first and second cantilever electrodes 50A and 50B are in contact with the first and second trap sites 80A and 80B by an electrical field induced by the charge applied to the first and second upper word lines 40A and 40B and the charge captured by the first and second trap sites 80A and 80B.

Even when a charge applied to the first and second upper word lines 40A and 40B and to the first and second cantilever electrodes 50A and 50B is eliminated, the first and second cantilever electrodes 50A and 50B are maintained being curved, wherein the tip of the first and second cantilever electrodes 50A and 50B contact the first and second trap sites 80A and 80B by an electrical field induced by the charge captured by the first and second trap sites 80A and 80B. This is why a charge having a polarity opposite the charge captured by the first and second trap sites 80A and 80B is concentrated and induced to the tip of the first and second cantilever electrodes 50A and 50B, wherein the first and second cantilever electrodes 50A and 50B can be maintained as the curved state by an electrostatic attractive force.

Accordingly, in the multibit electro-mechanical memory device according to the embodiment of the invention, first and second trap sites 80A and 80B, in which a charge applied through first and second upper word lines 40A and 40B is tunneled and trapped, are employed. Thus, even when a charge applied to the first and second upper word lines 40A and 40B and the first and second cantilever electrodes 50A and 50B is eliminated, the curved state of the first and second cantilever electrodes 50A and 50B can be maintained, thereby realizing a nonvolatile memory device.

To curve the first and second cantilever electrodes 50A and 50B in a third direction and maintain the curved state, the first and second upper word lines 40A and 40B to which a predefined charge is applied, and the first and second trap sites 80A and 80B, are stacked. Therefore, the length of first and second cantilever electrodes 50A and 50B is less than that of the conventional art. Further, an electrical contact portion and attractive portion can be unified on a vertical line according to an embodiment of the invention, thereby increasing an integration of memory devices.

In an upper part of the second interlayer insulating film 24, a third interlayer insulating film 28 is formed to provide support and insulation between the first and second trap sites 80A and 80B and between the first and second upper word lines 40A and 40B. For example, the third interlayer insulating film 28 is formed containing silicon oxide, silicon nitride, or silicon oxide nitride, to electrically insulate the first and second cantilever electrodes 50A and 50B and between the first and second upper word lines 40A and 40B.

Although not shown in the drawings, the first and second lower voids 90A and 90B, and the first and second upper voids 92A and 92B, may be spaces that are formed by removing first sacrifice layer (60 of FIG. 11A) and second sacrifice layer (70 of FIG. 15A) exposed to the trench 100. The voids 92A, 92B may be a space through which each tip of the first and second cantilever electrodes 50A and 50B can move in a third direction, i.e., Z-axis direction, perpendicular to the substrate 10.

Accordingly, the multibit electro-mechanical memory device comprises a unit cell 104 that is comprised of first and second memory units 102A and 102B separated from each other on the trench 100, or first and second memory units 102A and 102B separated from each other on the pad electrode 52. At this time, the first and second memory units 102A and 102B are adjacent each other in the first direction, i.e., X-axis direction, and electrically share one bit line 20. The first and second memory units 102A and 102B of each unit cell 104 adjacent to each other in the second direction, i.e., Y-axis direction, may electrically share the first lower word line 30A or second lower word line 30B, and may electrically share the first or second upper word line 40A or 40B.

The first and second cantilever electrodes 50A and 50B separated from each other by the trench 100 or pad electrode 52 are formed as part of the unit cell 104 that is classified as first and second memory units 102A and 102B, each performing a switching operation, and thus, each unit cell 104 can input/output data of two or more bits.

In an embodiment, the first and second upper word lines 40A and 40B to which an electrical signal to switch the first and second cantilever electrodes 50A and 50B is applied may be formed of conductive metal material having a low resistance as compared with a conventional polysilicon material, thus reducing a power consumption and increasing throughput.

Figure 4:
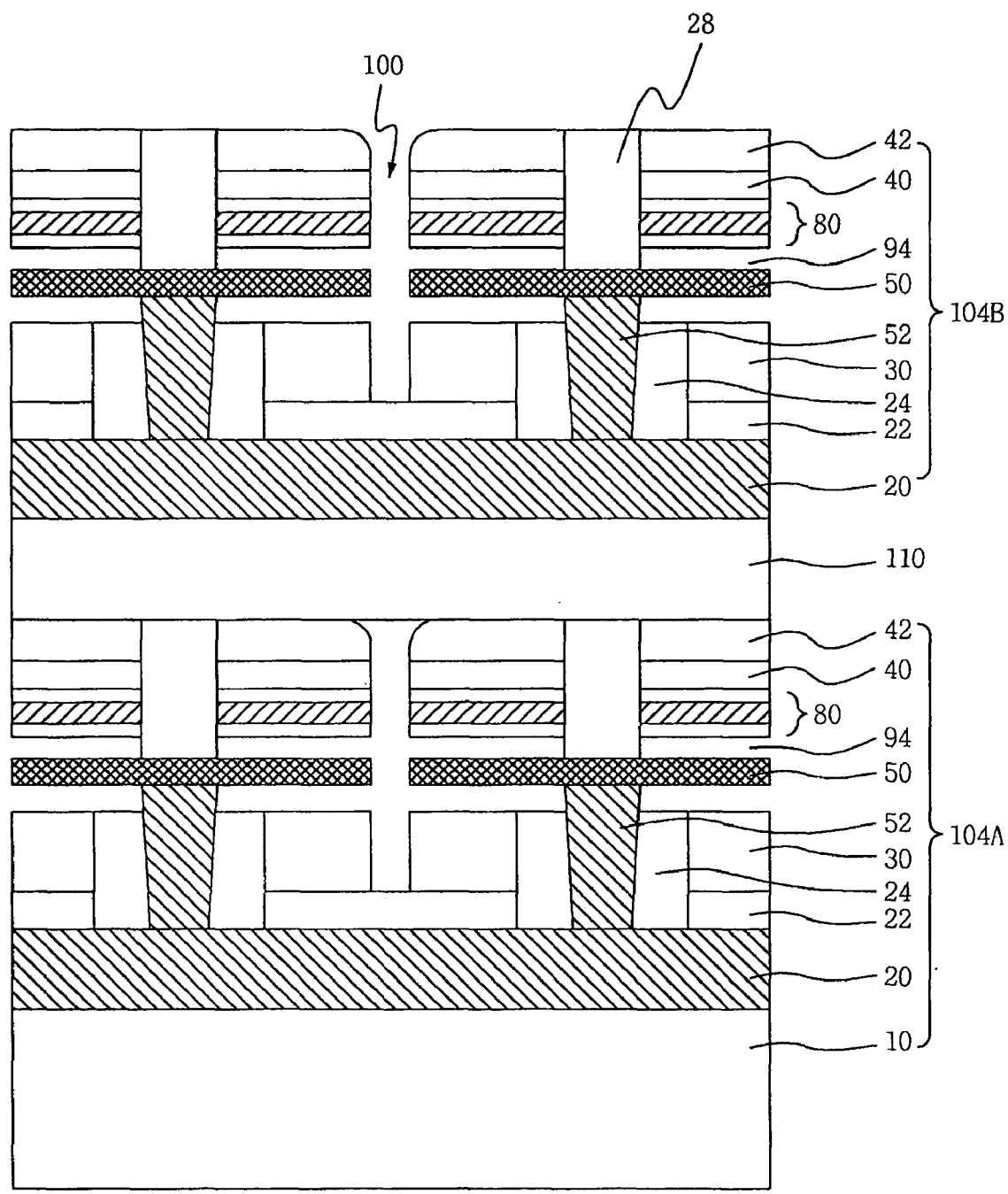
FIG. 4 is a sectional view of a stacked structure of multibit electro-mechanical memory devices shown in FIG. 3.

FIG. 4 is a sectional view of a stacked structure of multibit electro-mechanical memory devices shown in FIG. 3. A multibit electro-mechanical memory device according to an embodiment of the invention may be configured to have a stacked structure of a first unit cell 104A and a second unit cell 104B on a third interlayer insulating film 110 formed on the first unit cell 104A. The inside of the trench 100 of the first and second unit cells 104A and 104B may have a vacant vacuum state through which the cantilever electrode 50 can move upward and downward, or may be filled with non-reactive gas such as nitrogen gas or argon gas. Also, the fourth interlayer insulating film 110 may be formed to cover an upper part of the first unit cell 104A in order to distinguish the first unit cell 104A from the second unit cell 104B. At this time, the fourth interlayer insulating film 110 is formed so as not to flow into the inside of void 94 through the trench 100. For example, the fourth interlayer insulating film 110 is formed containing polymer material formed on the third interlayer insulating film 28 formed on the trench 100. Though not shown in the drawing, bit line 20 of the first unit cell 104A and bit line 20 of the second unit cell 104B may be formed in mutually different directions, or the trench 100 of the first unit cell 104A may be formed deviating from the trench 100 of the second unit cell 104B.

Thus, the multibit electro-mechanical memory device according to embodiments of the invention may have the structure of stacking the second unit cell 104B on the third interlayer insulating film 110 formed on the first unit cell 104A that is formed on the substrate 10, thereby permitting an increased integration of memory devices.

An operating method of multibit electro-mechanical memory device according to an embodiment of the invention is described as follows. The first and second lower word lines 30A and 30B, and the first and second cantilever electrodes 50A and 50B, and the first and second upper word lines 40A and 40B, may be each described herein as a lower word line 30, cantilever electrode 50 and upper word line 40, and also reference characters therefor may be changed in the description below. The first and second lower voids 90A and 90B may be described herein as a lower void 90, and the first and second upper voids 92A and 92B as an upper void 92. Further, the lower and upper voids may be all described herein as a void 94, and reference characters may be changed in the description below.

In the multibit electro-mechanical memory device according to an embodiment of the invention, predefined data can be programmed, deleted, or read according to a position of cantilever electrode 50. For example, when no electrical field is induced in the void 94, the cantilever electrode 50 can be supported horizontally at a height the same as or similar to the pad electrode 52. On the other hand, when electrical field of a predefined strength is induced in the void 94, a charge of a predetermined strength is concentrated at a tip of the cantilever electrode 50 by the electrical field, resulting in the cantilever electrode 50 to be curved in a third direction vertical to the substrate 10. At this time, program, delete, or readout operation can be performed by a switching operation that the tip of the cantilever electrode 50 is attached to or detached from the lower word line 30 or trap site 80.

Accordingly, program, delete, program and readout operations of each of first and second memory units 102A and 102B constituting the unit cell 104 can be individually performed by controlling a difference of voltage applied to each of the bit line 20, lower word line 30 and upper word line 40. In an embodiment, a predefined voltage is independently applied to the first and second lower word lines 30A and 30B, and a predefined voltage is independently applied to the first and second upper word lines 40A and 40B. Then, a state of the first and second memory units 102A and 102B may be equally programmed as "0" or "1" at the same time, or may be programmed to be different from each other as "0" and "1". At this time, the first and second memory units 102A and 102B electrically share one bit line 20, thus program and read operations thereof cannot be simultaneously performed, and any one of the first and second memory units 102A and 102B must have an electrical use of the bit line 20 at a given time.

Thus, in the multibit electro-mechanical memory device according to an embodiment of the invention, 2 bits of data can be input/output to/from a single unit cell that is constructed of first and second memory units 102A and 102B that are programmed to have the same state or different states, and formed symmetrically on both sides of the trench 100 or pad electrode 52.

As described above, when a charge having a polarity opposite to a charge applied to the lower word line 30 and trap site 80 is applied, the cantilever electrode 50 is curved to contact with the trap site 80 by an electrostatic force acting as an attractive force. Further, when a charge having the same polarity as the charge applied to the lower word line 30 and trap site 80 is applied, the cantilever electrode 50 can be separated from the trap site 80 by an electrostatic force acting as a repulsive force. When the cantilever electrode 50 is curved contacting with the trap site 80, it should overcome an elasticity or restoring force of a predefined strength. The elastic force or restoring force generally depends upon Hook's law proportionate to a movement distance, and the electrostatic force is based on Coulomb's law proportionate to the square of movement distance. The curved direction and moving direction of the cantilever electrode 50 may be each determined by an electrostatic force generated depending upon a polarity of charge and charge amount applied to the lower word line 30 and trap site 80.

FIGS. 5A to 6B are sectional views providing operations of programming to or reading data out of a multibit electro-mechanical memory device according to an embodiment of the invention.

Figure 5A:
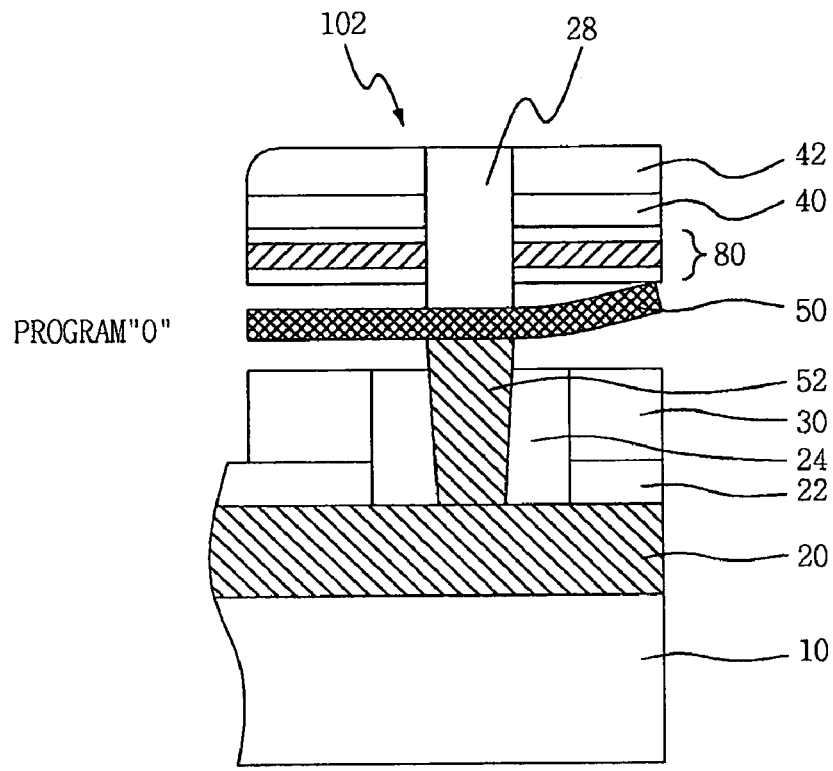
FIGS. 5A to 6B are sectional views providing operations of programming to or reading data out of a multibit electro-mechanical memory device according to an embodiment of the invention.
Figure 5B:
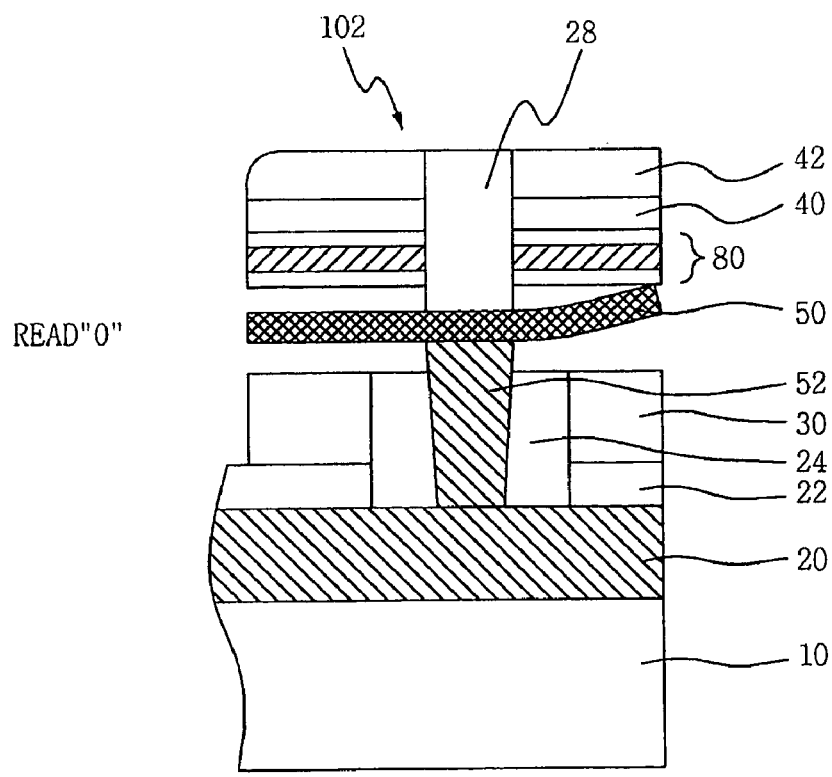

As shown in FIGS. 5A and 5B, to program data corresponding to '0' in a multibit electro-mechanical memory device according to an embodiment of the invention, a first voltage, i.e., Vpull-in, is applied between the upper word line 40 and the bit line 20, and, as a result, a tip of cantilever electrode 50 is curved downward. At this time, programming data corresponding to '0' may be called "PROGRAM '0'". That is, a first voltage having a predefined strength is applied between the bit line 20 and the word line 40 and so the tip of the cantilever electrode 50 is curved to be in contact with the trap site 80, thereby programming data corresponding to '0'. Further, a second voltage induced between the bit line 20 and the upper word line 40 and a third voltage induced between the bit line 20 and the lower word line 30, are compared, and when the second voltage is greater than the third voltage, data corresponding to '0' can be read out. Subsequently, in a preferred embodiment, a distance between the cantilever electrode 50 electrically connected to the bit line 20 and the upper word line 40 is shorter than a distance between the cantilever electrode 50 and the lower word line 30 and so the voltage is proportionate to an inverse number of the distance.

Consequently, in a multibit electro-mechanical memory device according to an embodiment of the invention, a first voltage having a predefined strength is applied to the cantilever electrode 50 electrically connected to the bit line 20 and the upper word line 40, and, thus, the tip of cantilever electrode 50 is curved to be in contact with the trap site 80, thus programming data corresponding to '0'. Additionally, the second voltage induced to between the bit line 20 and the upper word line 40, and the third voltage induced to between the bit line 20 and the lower word line 30, are compared, and when the second voltage is greater, data corresponding to '0' can be read out.

Figure 6A:
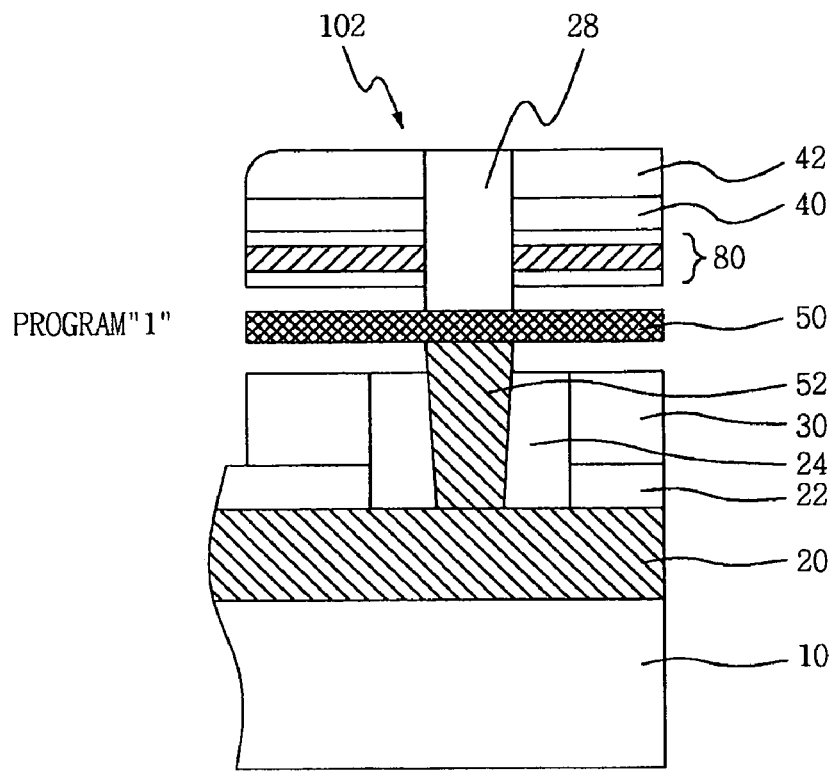
Figure 6B:
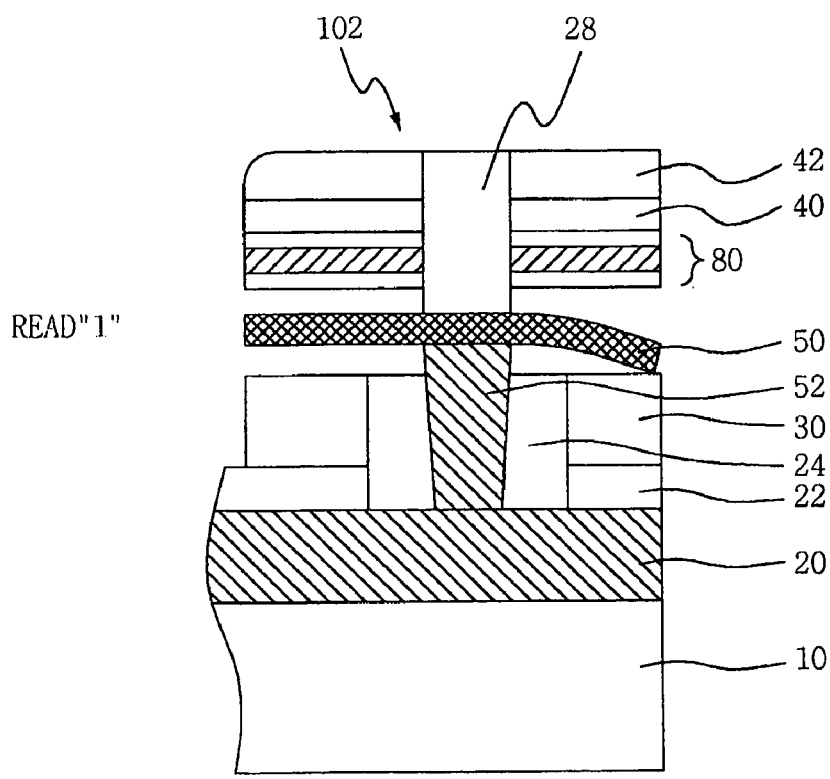

As shown in FIGS. 6A and 6B, to program data corresponding to '1' in a multibit electro-mechanical memory device according to an embodiment of the invention, a fourth voltage, i.e., Vpull-out, of a predefined strength is applied between the lower word line 30 and the bit line 20, and, thus, the tip of cantilever electrode 50 is separated from the trap site 80, and to return to a horizontal state of the cantilever electrode 50. When the tip of the cantilever electrode 50 is already separated from the trap site 80, it does not matter whether the fourth voltage is not applied. Programming data corresponding to '1' may be called "PROGRAM '1'". Further, the second voltage induced between the bit line 20 and the upper word line 40 and the third voltage induced between the bit line 20 and the lower word line 30 are compared, and when the second voltage is greater than the third voltage, data corresponding to '1' can be read out. In reading the data corresponding to '1', the cantilever electrode 50 is positioned near the lower word line 30 as compared with the upper word line 40. The cantilever electrode 50 can be curved to electrically contact with lower word line 30 by an electrostatic force acting as an attractive force between the cantilever electrode 50 and the lower word line 30.

Therefore, in the multibit electro-mechanical memory device according to an embodiment of the invention, data of '0' or '1' can be programmed according to a contact state or separated state between the tip of cantilever electrode 50 and the trap site 80, and data of '0' or '1' can be read out corresponding to a curved direction of the cantilever electrode 50.

Figure 7:
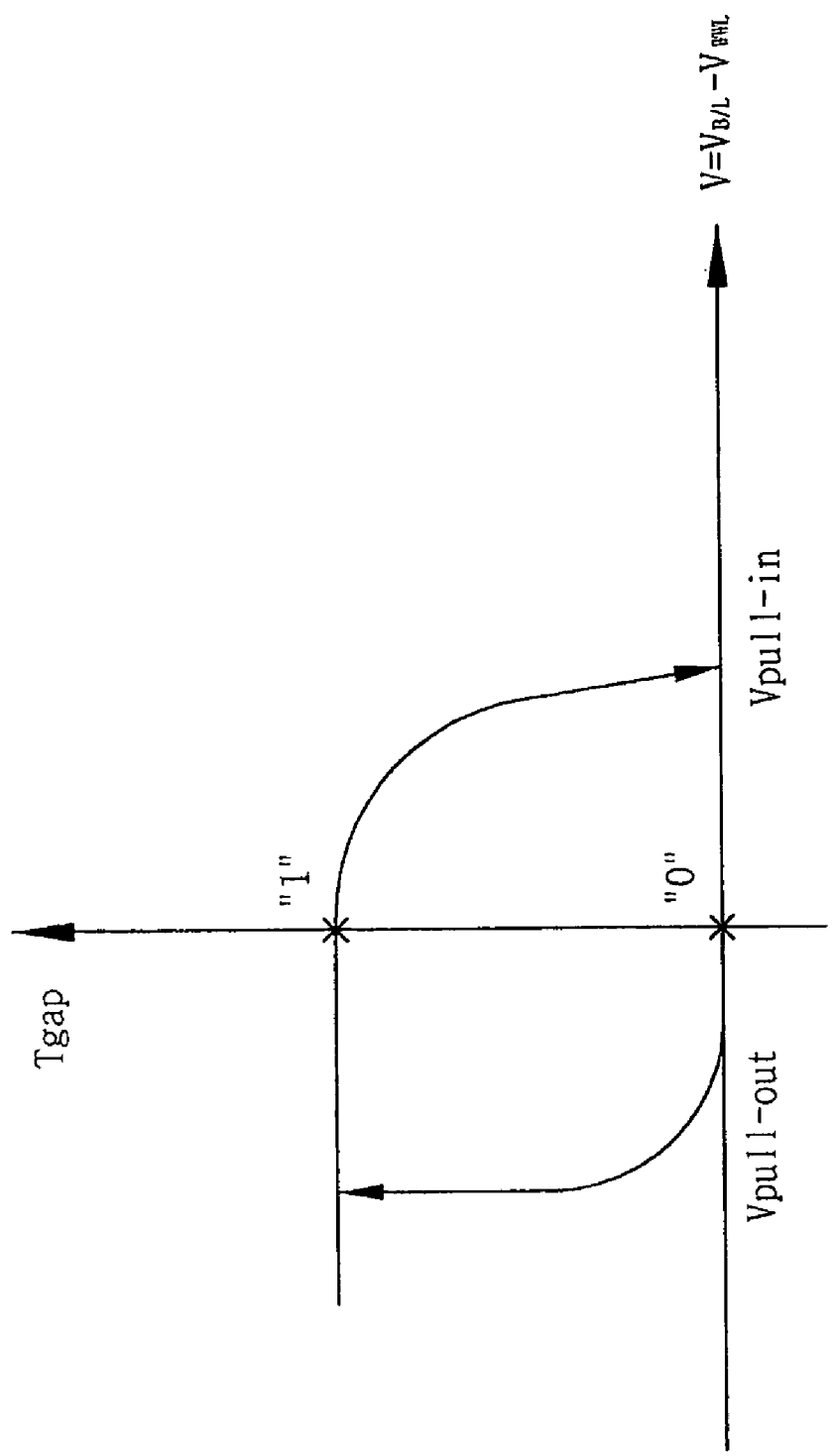
FIG. 7 is a graph illustrating a correlation between a voltage applied through a bit line and lower word line and a movement distance of a tip of a cantilever electrode in a multibit electro-mechanical memory device according to an embodiment of the invention.

FIG. 7 is a graph illustrating a correlation between a voltage applied through the bit line 20 and the upper word line 40 and a movement distance of the tip of cantilever electrode 50 in a multibit electro-mechanical memory device according to an embodiment of the invention. When a voltage of "Vpull-in" having a positive value is applied between the bit line 20 and the upper word line 40, the tip of cantilever electrode 50 is curved up to contact with the trap site 80 and thus data corresponding to '0' is programmed. When a voltage of "Vpull-out" having a negative value is applied between the bit line 20 and the upper word line 40, the tip of cantilever electrode 50 is separated from the trap site 80 and thus data corresponding to '1' can be programmed. Here, a transverse axis indicates the magnitude of voltage, and a longitudinal axis indicates a movement distance that the tip of cantilever electrode 50 moves from the surface of the trap site 80 to the lower word line 30. When a voltage of "Vpull-in" having a positive value or a voltage of "Vpull-out" having a negative value is applied to the upper word line 40 and the cantilever electrode 50 connected to the bit line 20, the tip of cantilever electrode 50 is contacted with or separated from the trap site 80, thus programming digital data corresponding to 1 bit having a value of '0' or '1'.

At this time, the voltage of "Vpull-in" and "Vpull-out" may be decided by the following formula.

(Mathematical Formula)

$$V = V_{B/L} - V_{WWL}$$

The "V" indicates voltage of "Vpull-in" or "Vpull-out", and "$V_{B/L}$" designates a voltage applied to the bit line 20, and "$V_{WWL}$" indicates a voltage applied to the upper word line 40. At this time, the voltage of "Vpull-in" has a positive value, and the voltage of "Vpull-out" has a negative value. For example, when absolute values of the voltage of "Vpull-in" and the voltage of "Vpull-out" are the same or similar to each other, a voltage of ½*"Vpull-in" is applied to the bit line 20 and a voltage of ½*"Vpull-out" is applied to the upper word line 40 in programming data corresponding to a value of '0', thereby electrically contacting the tip of cantilever electrode 50 to the upper word line 40 through an upward curved operation of the cantilever electrode 50.

Furthermore, in programming data corresponding to '1', a voltage of ½*"Vpull-out" is applied to the bit line 20 and a voltage of ½*"Vpull-in" is applied to the upper word line 40, thereby separating the cantilever electrode 50 from the upper word line 40. Though not shown in the drawing, bit line 20, lower word line 30 and upper word line 40, to which the voltage of "Vpull-in" or "Vpull-out" is not applied, have a grounded state.

A method of manufacturing a multibit electro-mechanical memory device described above according to an embodiment of the invention is described as follows.

FIGS. 8A to 18B are sectional views of processes to manufacture a multibit electro-mechanical memory device according to an embodiment of the invention. FIGS. 8A to 18A are sectional views of sequential processes taken along a line I-I' of FIG. 2 and FIGS. 8B to 18B are sectional views of sequential processes taken along a line II~II' of FIG. 2.

Figure 8A:
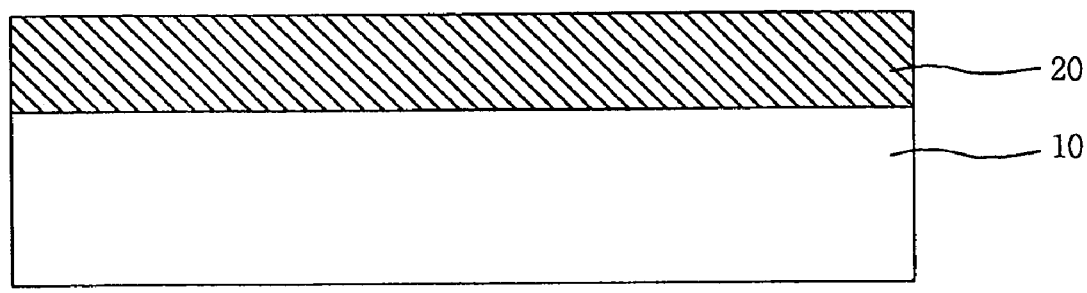
FIGS. 8A to 18B are sectional views of processes to manufacture a multibit electro-mechanical memory device according to an embodiment of the invention.
Figure 8B:
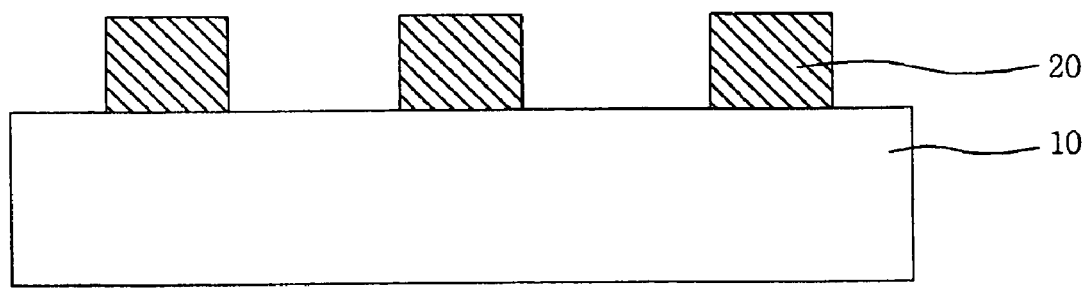

As shown in FIGS. 8A and 8B, a bit line 20 with a predefined thickness is formed in a first direction on a substrate 10 of a horizontal state. That is, a plurality of bit lines 20 are formed in parallel in the first direction on the substrate 10. In an embodiment, the bit line 20 can contain a conductive metal film such as gold, silver, copper, aluminum, tungsten, tungsten silicide, titanium, titanium nitride, tantalum, tantalum silicide formed by a physical vapor deposition (PVD) or chemical vapor deposition (CVD), or other conductive metal film known to those of skill in the art, or contain a polysilicon film or crystal silicon film doped with conductive impurity. Although not shown in the drawing, the bit line 20 may be formed by aeolotropically etching the polysilicon layer or conductive metal film formed with a predefined thickness on an entire face of the substrate 10, through a dry etching method that employs a first hard mask layer (not shown) or photoresist pattern as an etch mask layer, the first hard mask layer or photoresist pattern being for shielding thereon to form a given line width. For example, a reactive gas used for the dry etching method of the conductive metal layer or polysilicon layer may contain a strong acid gas mixed with sulphuric acid and nitric acid. In an embodiment, the bit line 20 is formed to have a thickness of about 200 Å and a line width of about 50 Å.

Figure 9A:
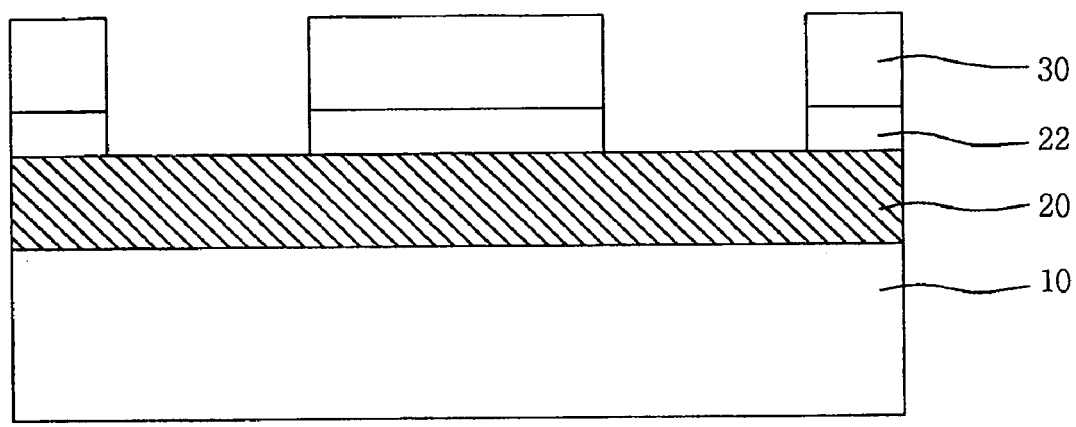
Figure 9B:
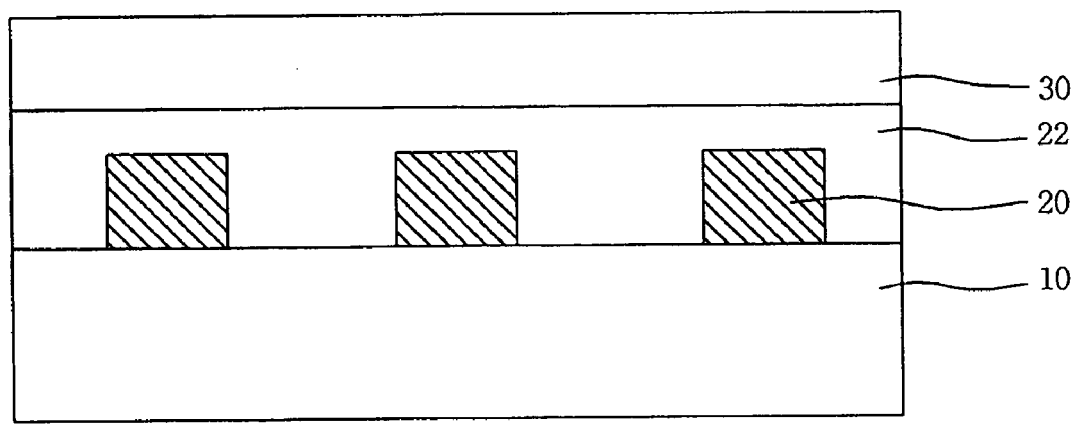

As shown in FIGS. 9A and 9B, a first interlayer insulating film 22 and lower word line 30 are formed with a given line width in second direction intersecting the bit line 20. The first interlayer insulating film 22 and the lower word line 30 are formed being stacked each having a predefined thickness, and are aeolotropically etched through the dry etching method that uses photoresist pattern and a second hard mask layer (not shown) formed on the lower word line 30 as an etching mask layer. The second hard mask layer and photoresist pattern are removed. In an embodiment, the first interlayer insulating film 22 contains silicon oxide or silicon nitride, and is formed having a thickness of about 150 Å through about 200 Å. The first interlayer insulating film 22 may function as an etch stop layer in a subsequent process of forming trench 100 to separate the lower word line 30 in a length direction. In an embodiment, the lower word line 30 includes a conductive metal layer having a prominent conduction, such as gold, silver, copper, aluminum, tungsten, tungsten silicide, titanium, titanium nitride, tantalum, tantalum silicide, or other conductive metal layer known to those skilled in the art, and is formed having a thickness of about 200 Å through PVD or CVD. The lower word line 30 and the first interlayer insulating film 22 are formed having a line width of about 50 Å. A reactive gas used for the dry etching method to pattern the lower word line 30 and the first interlayer insulating film 22 may be gas of FC-group such as $C_xF_y$ group or $C_aH_bF_c$ group, etc. Gas of the FC-group may be formed of gas such as $CF_4$, $CHF_3$, $C2F_6$, $C_4F_8$, $CH_2F_2$, $CH_3F$, $CH_4$, $C_2H_2$, $C_4F_6$ etc. or their mixture.

Figure 10A:
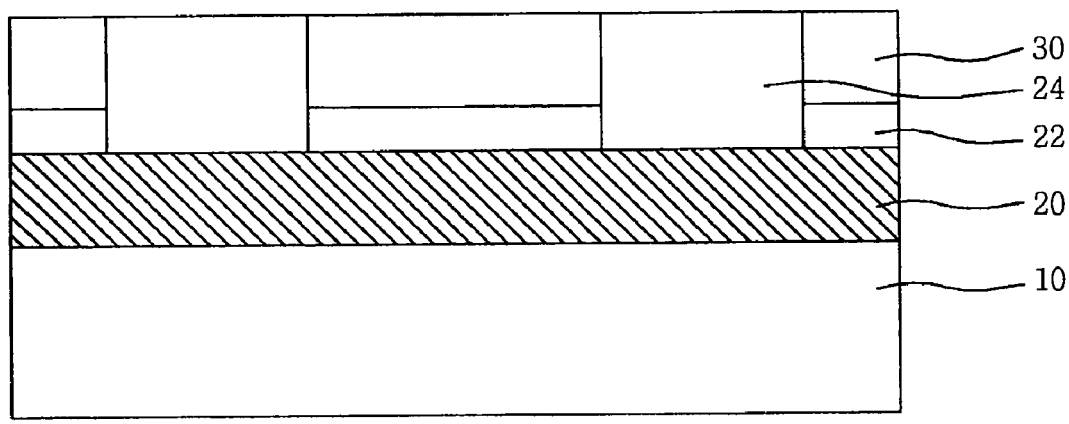
Figure 10B:
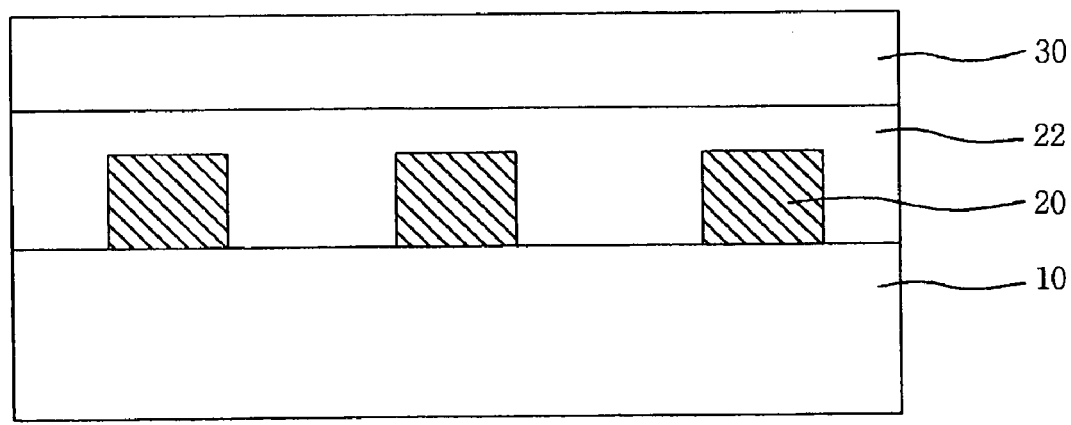

As shown in FIGS. 10A and 10B, second interlayer insulating film 24 is formed filling in the sidewall of the stack that includes the first interlayer insulating film 22 and the lower word line 30. The second interlayer insulating film 24 electrically isolates neighboring unit cells from each other, for example, each unit cell 104 including the first interlayer insulating film 22 and the lower word line 30. For example, the second interlayer insulating film 24 may be formed by forming a silicon oxide layer on an entire face of substrate 10 on which the stack has been formed, to cover the stack, through CVD, and then removing the silicon oxide layer to be planarized and exposing the lower word line 30.

Figure 11A:
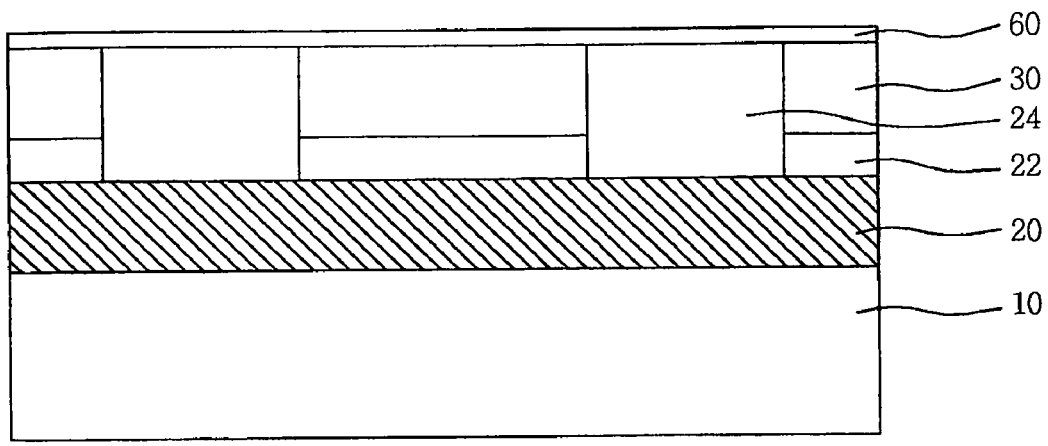
Figure 11B:
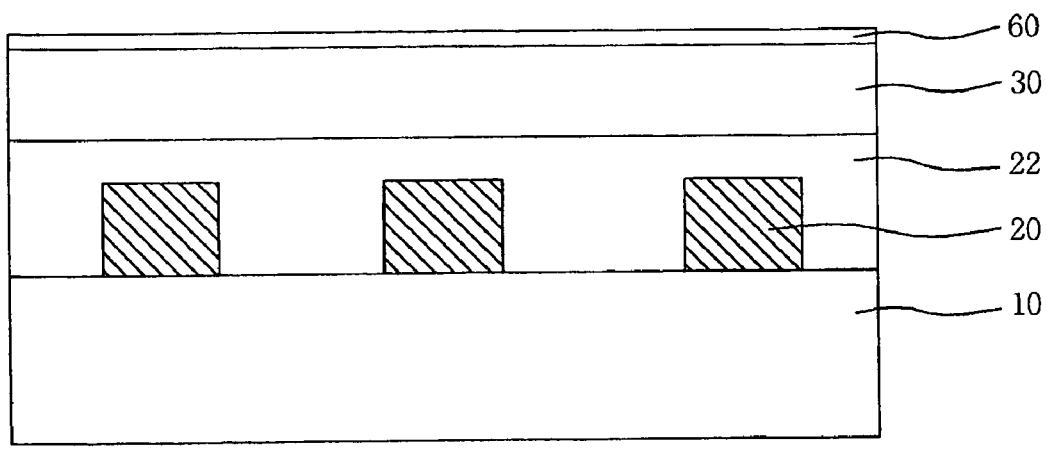

As shown in FIGS. 11A and 11B, a first sacrifice layer 60 is formed on the substrate on which the second interlayer insulating film 24 has been formed. In an embodiment, the first sacrifice layer 60 is formed of polysilicon material by an atom layer deposition or CVD, having a thickness of about 50 Å to about 150 Å. In an embodiment, the first sacrifice layer 60 may be planarized on an entire face of the second interlayer insulating film and the lower word line 30.

Figure 12A:
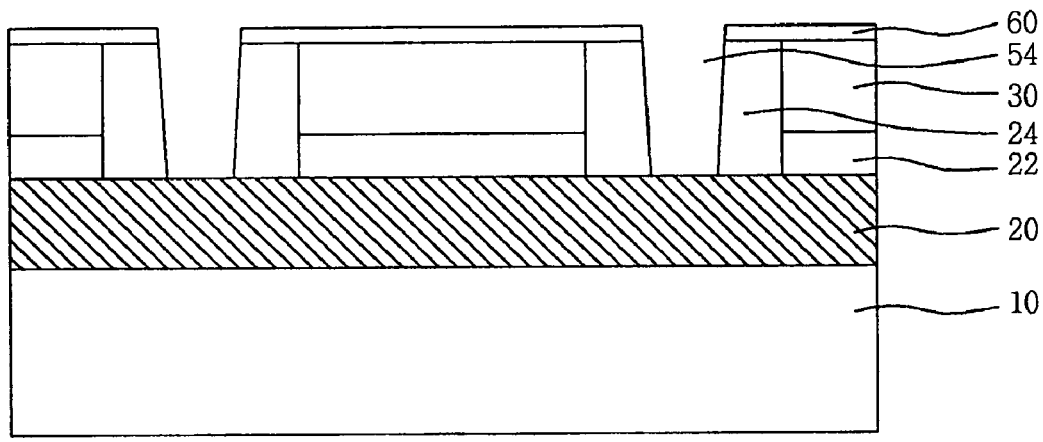
Figure 12B:
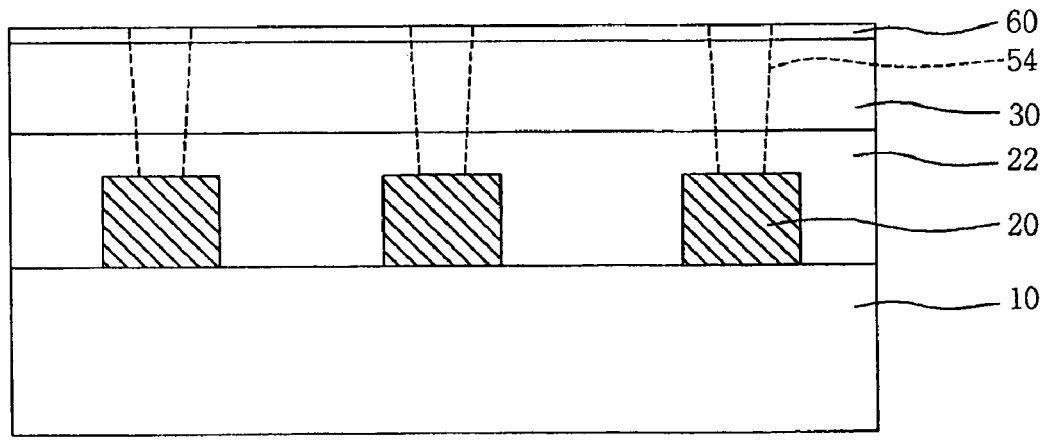

As shown in FIGS. 12A and 12B, the first sacrifice layer 60 formed on the second interlayer insulating film 24 and the second interlayer insulating film 24 formed in the side face of the lower word line 30 are sequentially removed, then a contact hole 54 is formed that selectively exposes the bit line 20. The contact hole 54 must be formed so as not to expose the sidewall of the first interlayer insulating film 22 and the lower word line 30 between adjacent unit cells 104 (see FIG. 3). This is why the pad electrode 52 formed inside the contact hole 54 in a subsequent process should apply a charge applied through the bit line 20 independently from a charge applied to the trap site 80 and the lower word line 30. For example, the contact hole 54 is formed herein through the dry etching method to expose the bit line 20, the dry etching method being for using photoresist pattern or third hard mask layer (not shown) as a mask layer, the photoresist pattern or third hard mask layer selectively exposing an upper part of the second interlayer insulating film on the first sacrifice layer. In an embodiment, the contact hole 54 has a radius of about 20 Å through about 80 Å.

Figure 13A:
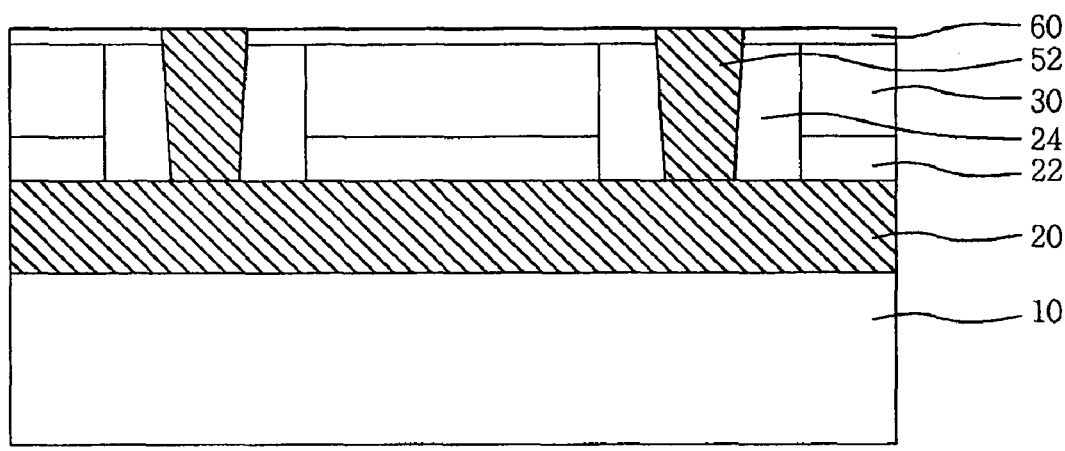
Figure 13B:
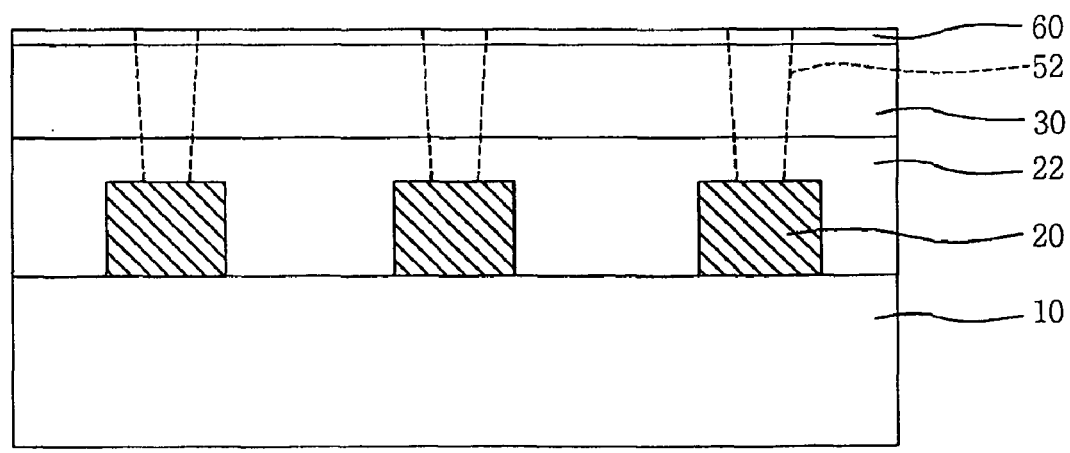

As shown in FIGS. 13A and 13B, a pad electrode 52 is formed being buried in the contact hole 54. The pad electrode 52 is electrically connected to the bit line 20 exposed to the contact hole 54. Although not shown in the drawing, at least one conductive layer may be further formed to produce an ohmic contact between the bit line 20 and the pad electrode 52. For example, the pad electrode 52 of a predefined thickness may be produced by forming a conductive metal layer filling in the contact hole 54 through the PVD or CVD, and by removing the conductive metal layer to be planarized so as to expose the second interlayer insulating film 24 and first sacrifice layer 60. Thus, the pad electrode 52 is formed to have the same or similar height as the second interlayer insulating film 24 and the first sacrifice layer 60. Also, an oxide removing process or etching process may be further executed to remove an oxide layer formed on the surface of the bit line 20 exposed to the contact hole 54, before forming the pad electrode 52. In an embodiment, the pad electrode 52 protrudes at a level that is higher than the height of the second interlayer insulating film 24 when the first sacrifice layer 60 is removed in a subsequent process.

Figure 14A:
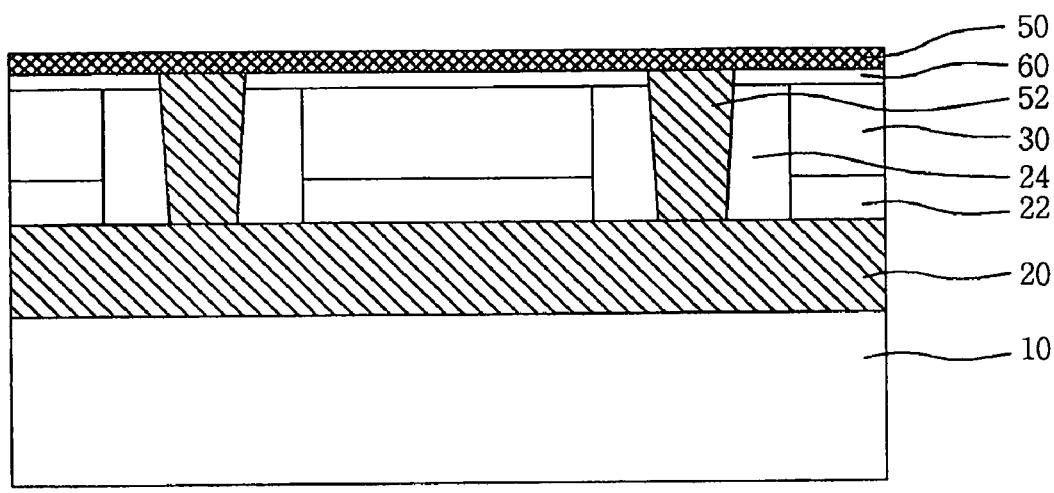
Figure 14B:
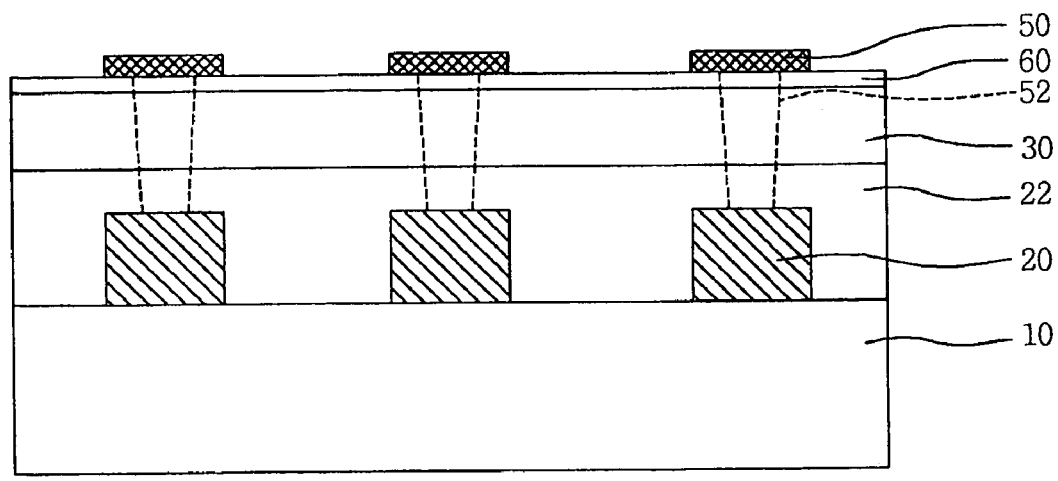

As shown in FIGS. 14A and 14B, a cantilever electrode 50 having a given line width is formed on the pad electrode 52, crossing the upper part of the first sacrifice layer 60, lower word line 30 and first interlayer insulating film 22 in the first direction. In an embodiment, the cantilever electrode 50 has the same or similar line width to the bit line 20, in the first direction paralleled with the bit line 20, and is formed on the first sacrifice layer 60 and the pad electrode 52, and thus may be referred to herein an upper bit line. At this time, the upper bit line may be formed as the cantilever electrode 50, which has a node that is divided by a trench 100 formed in a subsequent process. For example, the cantilever electrode 50 may be formed containing titanium, titanium nitride, or carbon nanotube formed with a thickness of about 30 Å through about 50 Å through the PVD, CVD or electrical discharge. At this time, the cantilever electrode 50 may be patterned and formed through the dry etching method that employs a photoresist pattern or fourth hard mask layer (not shown) as an etching mask, the photoresist pattern or fourth hard mask layer being for shielding the titanium, titanium nitride or carbon nanotube formed on the bit line 20. The fourth hard mask layer is removed in the patterning of the cantilever electrode 50.

Accordingly, in a method of manufacturing a multibit electro-mechanical memory device according to an embodiment of the invention, a cantilever electrode 50 is formed in the first direction on the pad electrode 52 electrically connected to the bit line 20 formed in the first direction on the substrate 10, thereby increasing an integrated level of devices at most.

Figure 15A:
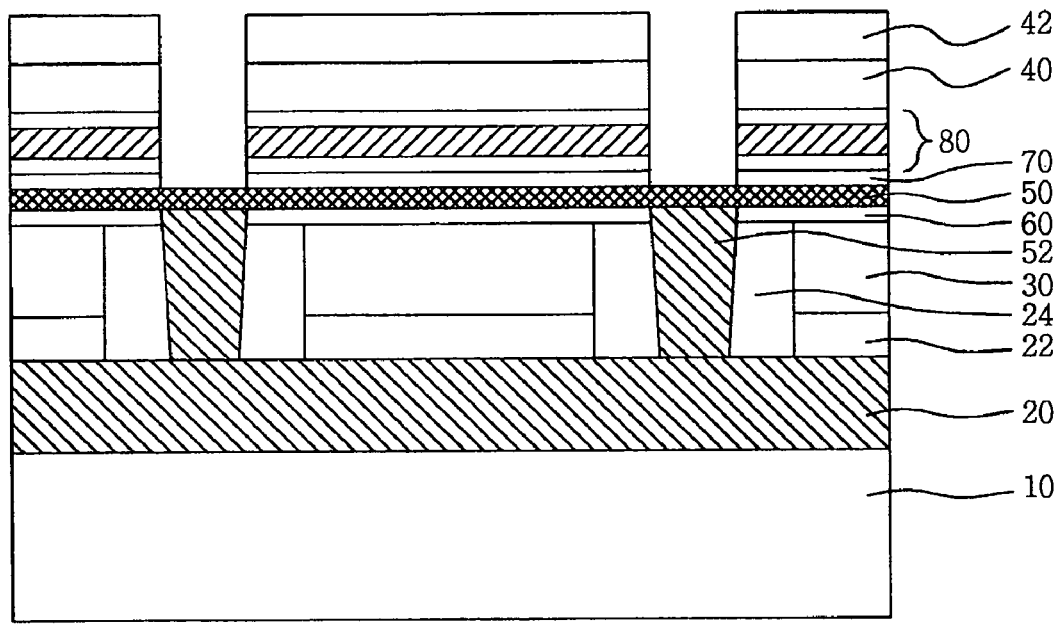
Figure 15B:
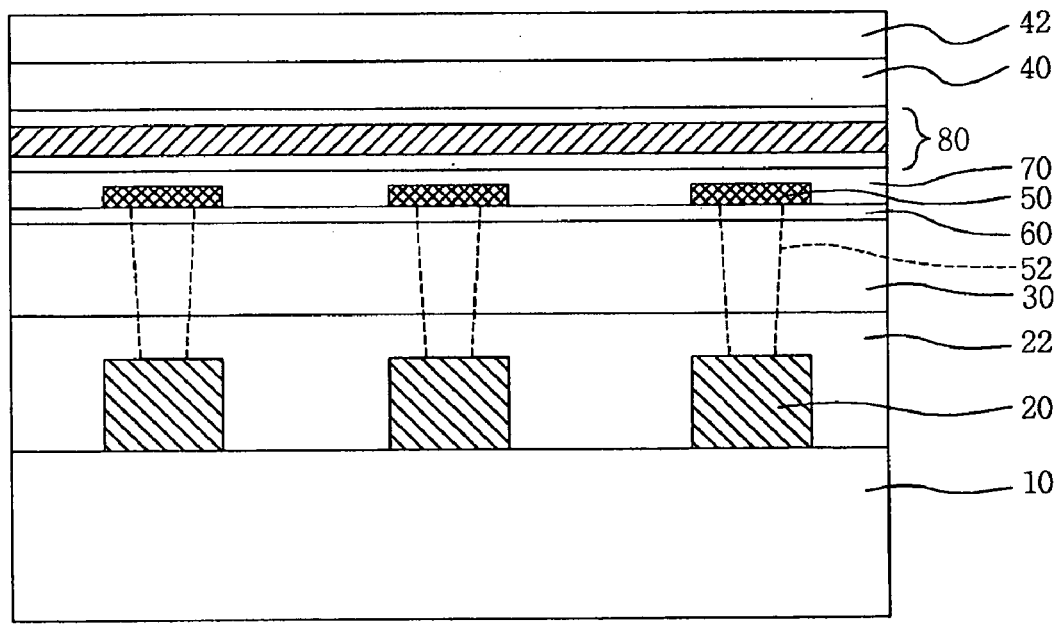

As illustrated in FIGS. 15A and 15B, on the cantilever electrode 50, a second sacrifice layer 70, trap site 80 and upper word line 40 are formed in a second direction parallel to the first sacrifice layer 60, lower word line 30, first interlayer insulating film 24. The second sacrifice layer 70, trap site 80 and upper word line 40 are formed symmetrically to the first sacrifice layer 60 and the lower word line 30, interposing the cantilever electrode 50 therebetween. In an embodiment, the second sacrifice layer 70 is formed of polysilicon material formed by an atom layer deposition or CVD, similar to the first sacrifice layer 60, and has the thickness of about 50 Å to about 150 Å. The trap site 80 is formed to include a first silicon oxide layer 82, silicon nitride layer 84, and second silicon oxide layer 86, having thicknesses of about 100 Å, 200 Å and 100 Å, respectively, through the CVD. The upper word line 40 is formed having a thickness of about 200 Å. The second sacrifice layer 70 and the upper word line 40 are formed to each have a line width of about 50 Å. At this time, the second sacrifice layer 70, trap site 80, and upper word line 40 may be formed as follows.

On an entire face of the substrate 10 on which the cantilever electrode 50 has been formed, a polysilicon layer, first silicon oxide layer 82, silicon nitride layer 84, second silicon oxide layer 86, conductive metal layer and fifth hard mask layer 42 are sequentially stacked, each having a predefined thickness through the CVD. Then, a photoresist pattern is formed to shield the fifth hard mask layer 42 formed above the first lower word line 30 and the first interlayer insulating film 24, and the fifth hard mask layer 42 is removed through the dry etching method or wet etching method that uses the photoresist pattern as an etching mask. Next, the photoresist pattern is removed by an ashing process. Finally, the conductive metal layer, second silicon oxide layer 86, silicon nitride layer 84, first silicon oxide layer 82 and polysilicon layer are etched sequentially and aeolotropically through the dry or wet etching method that uses the fifth hard mask layer 42 as the etching mask, thereby forming the upper word line 40, trap site 80 and second sacrifice layer 70. At this time, in patterning the second sacrifice layer 70, trap site 80 and upper word line 40, the cantilever electrode 50 formed on the pad electrode 52 can be exposed.

Figure 16A:
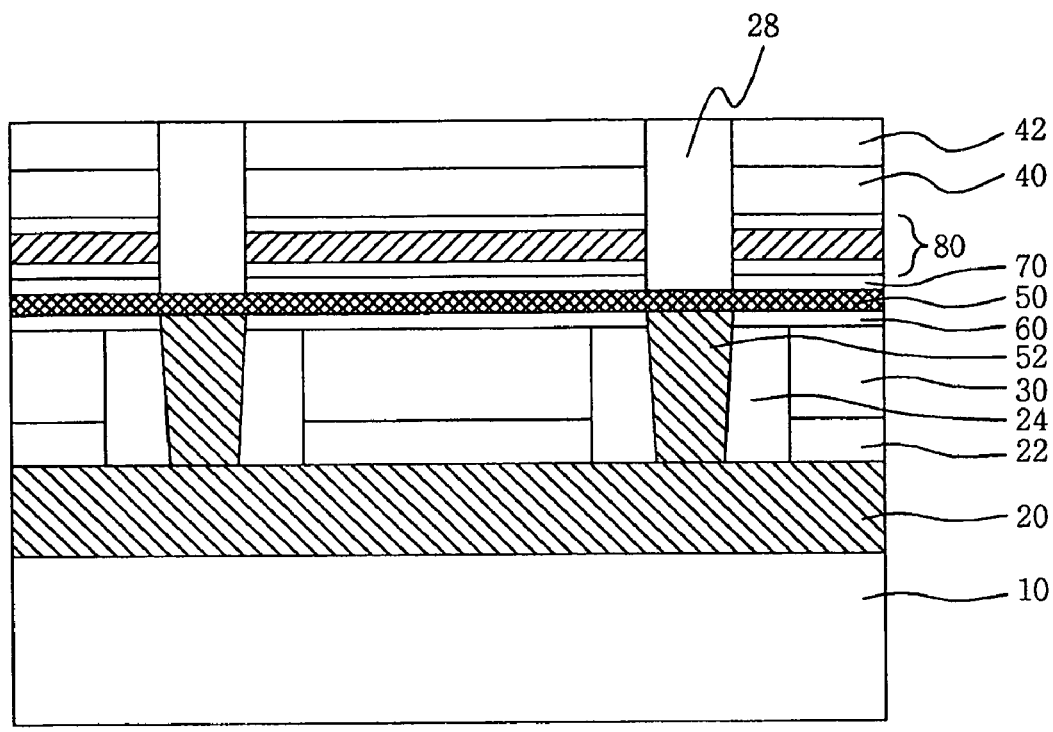
Figure 16B:
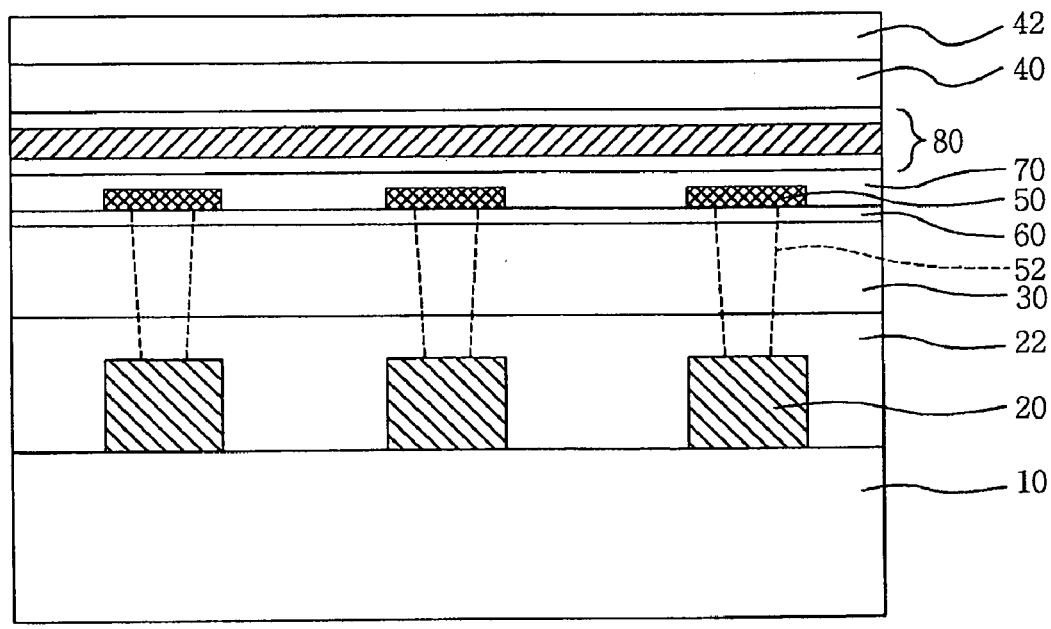

As shown in FIGS. 16A and 16B, a third interlayer insulating film 28 of a predefined thickness is formed on the cantilever electrode 50 formed on the pad electrode 52, the fifth hard mask layer 42 and the second interlayer insulating film 24, and the third interlayer insulating film 28 is planarized to expose the fifth hard mask layer 42. The third interlayer insulating film 28 has the same or similar thickness as that of the second sacrifice layer 70, trap site 80, and upper word line 40. Thus, when the second sacrifice layer 70 is removed in a subsequent process, the third interlayer insulating film 28 supports the side face of the trap site 80 and the upper word line 40, thereby suspending the trap site 80 and the upper word line 40 from the cantilever electrode 50. For example, the third interlayer insulating film 28 is formed including a silicon oxide layer formed through a plasma CVD. Further, the third interlayer insulating film 28 may be planarized through a chemical mechanical polishing. At this time, when the third interlayer insulating film 28 is planarized by using the upper word line 40 as an etch stop layer, the upper word line 40 formed of conductive metal layer may be damaged; thus the fifth hard mask layer 42 must be used as the etch stop layer. When the fifth hard mask layer 42 is excessively removed, the thickness of the fifth hard mask layer 42 may be increased by depositing a silicon nitride layer on the fifth hard mask layer 42.

Figure 17A:
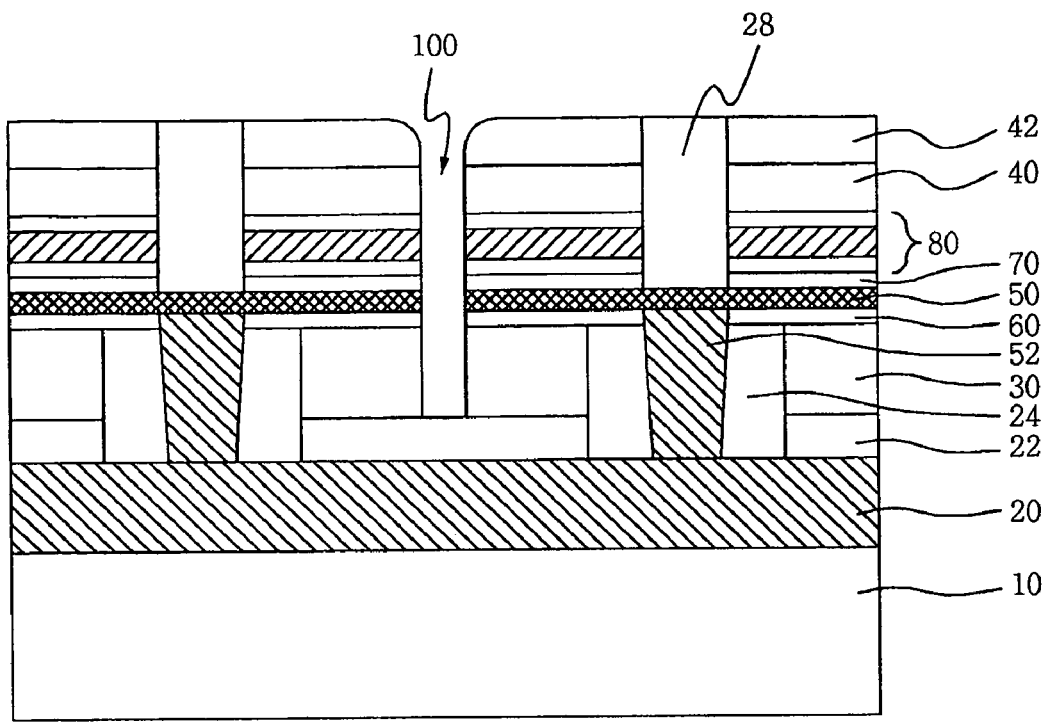
Figure 17B:
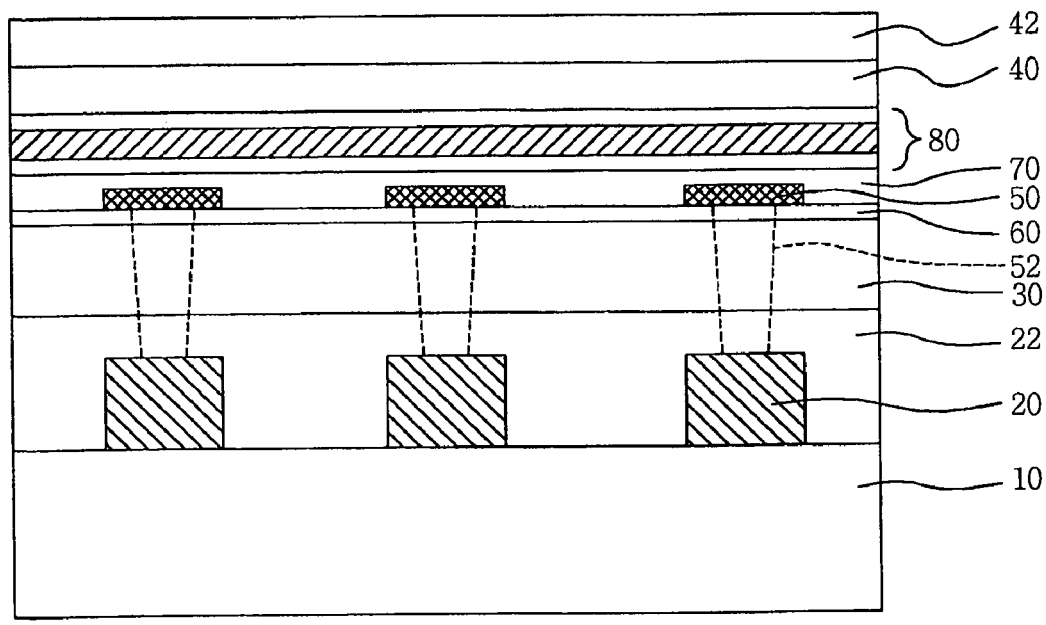

With reference to FIGS. 17A and 17B, the fifth hard mask layer 42 is etched via the dry etching method that uses photoresist pattern as an etching mask. The photoresist pattern exposes, in the second direction, a center portion of the fifth hard mask 42 formed on the upper word line 40. Next, the photoresist pattern is removed. The upper word line 40, trap site 80, second sacrifice layer 70, cantilever electrode 50, first sacrifice layer 60 and lower word line 30 are removed through the dry etching method using the fifth hard mask layer 42 as the etching mask, thus forming trench 100 to expose the first interlayer insulating film 24. The trench 100 is formed to separate in the second direction the upper word line 40, trap site 80, and lower word line 30, and to separate a node of the cantilever electrode 50, and furthermore to easily remove the first and second sacrifice layers 60 and 70. For example, a reactive gas used for the dry etching method may be gas of FC-group such as $C_xF_y$ group or $C_aH_bF_c$ group etc. The gas of FC-group may be gas such as $CF_4$, $CHF_3$, $C_2F_6$, $C_4F_8$, $CH_2F_2$, $CH_3F$, $CH_4$, $C_2H_2$, $C_4F_6$, etc., or their mixture gas. Thus, the trench 100 has a given line width to separate, symmetrically in the first direction, the upper word line 40, second sacrifice layer 70, cantilever electrode 50, first sacrifice layer 60, and lower word line 30 into both sides. And, in a subsequent process, etchant solution or reactive gas to isotropically eliminate the first and second sacrifice layers 60 and 70 formed in a lower part of the trap site 80 may be easy to flow into the trench 100. In an embodiment, the trench 100 may be formed herein having a line width of about 30 Å to about 800 Å.

Figure 18A:
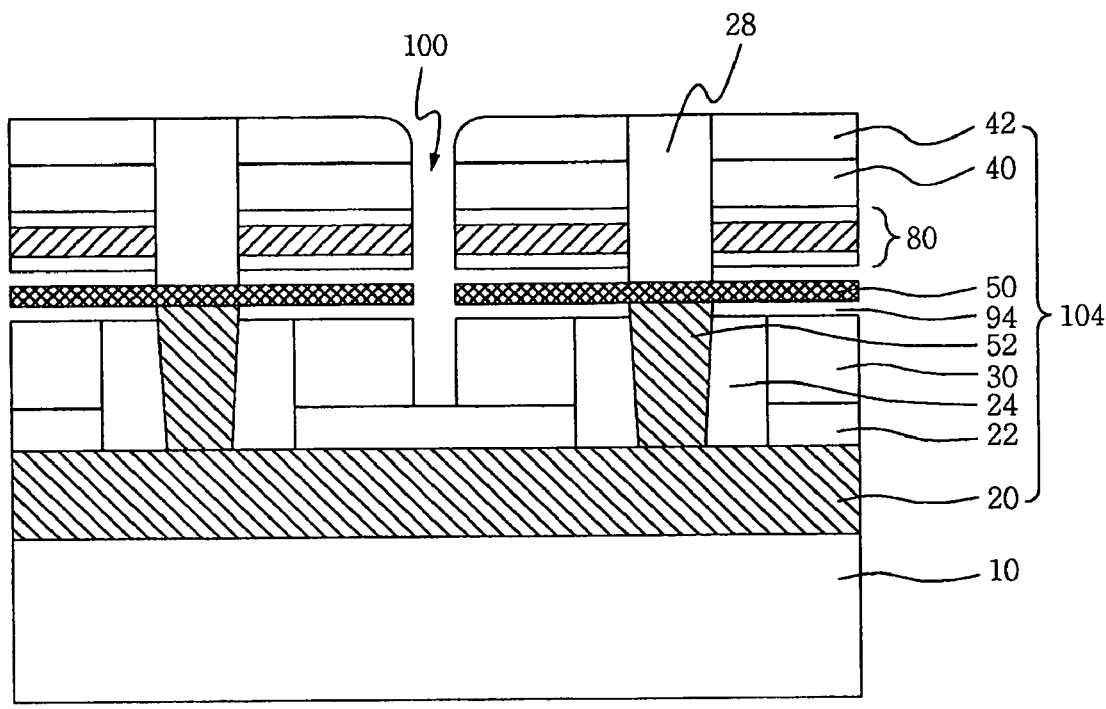
Figure 18B:
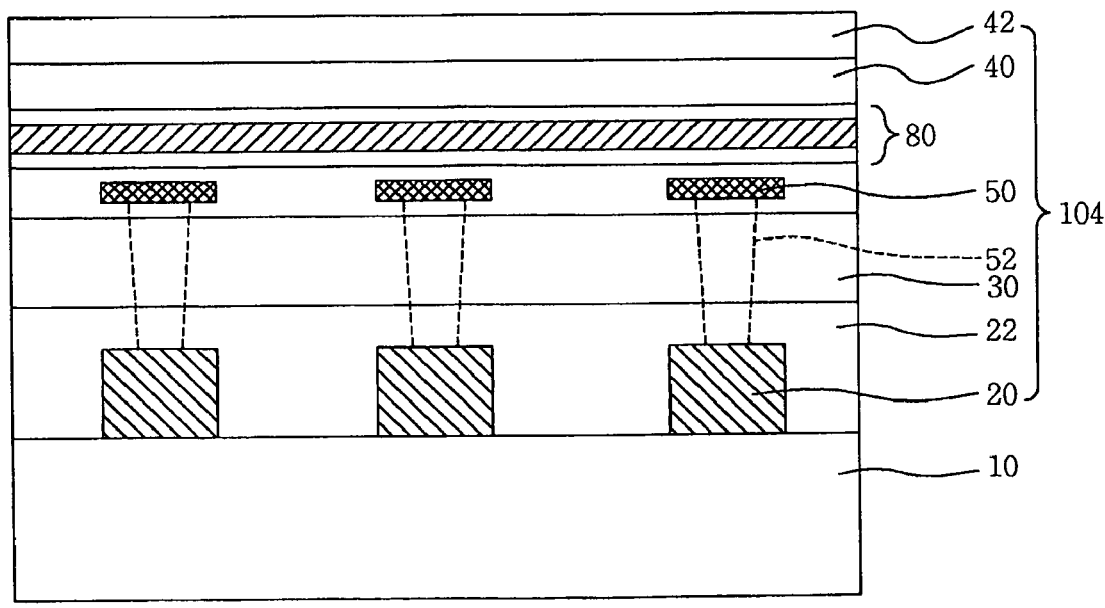

As shown in FIGS. 18A and 18B, the first sacrifice layer 60 and second sacrifice layer 70 exposed to the trench 100 are removed, thus forming voids 94 through which the cantilever electrode 50 is suspended between the lower word line 30 and the upper word line 40. For example, the first and second sacrifice layers 60 and 70 may be etched and removed through an isotropy etch from a face exposed to a sidewall of the trench 100 in a side direction through the wet or dry etching method. An etchant solution used for the wet etching method of the first and second sacrifice layers 60 and 70 formed of polysilicon material may be a mixture solution obtained by mixing a strong acid such as nitric acid, HF and acetic acid with deionized water by a given density. Reactive gas used for the dry etching method of the first and second sacrifice layers 60 and 70 may be gas of the FC-group such as $CF_4$, $CHF_3$ etc. An etchant solution or reactive gas used for the wet or dry etching method horizontally eliminates the first and second sacrifice layers 60 and 70 exposed to a sidewall of the trench 100, thereby forming the voids 94 between the upper and lower word lines 40 and 30.

Although not shown in FIGS. 18A and 18B, in an embodiment, a fourth interlayer insulating film 110 (see FIG. 4) covering an upper part of the trench 100 seals or otherwise encloses the trench 100. In an embodiment, the void 94 inside the trench 100 can be filled with a non-reactive gas such as nitrogen in air or argon, and may be determined to have a vacuum state to increase a curved speed of the cantilever electrode 50. For example, the fourth interlayer insulating film 110 is formed of polymer material that does not flow into the inside of the trench 100, but that covers the third interlayer insulating film 28 and the fifth hard mask layer 42. In addition, a memory device having a multilayer structure may be manufactured by sequentially forming another bit line 20, lower word line 30, cantilever electrode 50 and upper word line 40 on an upper part of the substrate 10 on which the fourth interlayer insulating film 110 has been formed.

Consequently, in a method of manufacturing a multibit electro-mechanically memory device according to an embodiment of the invention, plural lower word lines 30, cantilever electrodes 50, trap sites 80, and upper word lines 40 can be formed symmetrically by using trench 100 formed in a second direction intersecting bit line 20 formed in a first direction on substrate 10, thereby increasing integration of the memory devices.

As described above, according to some embodiments of the invention, first and second lower word lines are formed in a second direction that intersects a bit line formed in a first direction and cantilever electrodes are formed over the first and second lower word lines in the same first direction as the bit line, thereby configuring a matrix type cell array and so increasing an integrated level.

Further, to curve the first and second cantilever electrodes into a third direction and maintain the curved state, first and second upper word lines to which a predefined charge is applied, and the first and second trap sites, are stacked. Therefore, the length of first and second cantilever electrodes is lessened as compared with the conventional art, and furthermore, electrical contact portion and attractive portion applied to the conventional art can be unified on a vertical line according to an embodiment of the invention, thereby maximizing the integration of memory devices.

First and second cantilever electrodes separated into both sides on trench or pad electrode are formed in unit cells that are classified as first and second memory units performing a separate switching operation. Thus, data of two or more bits can be input or output each unit cell.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A memory device comprising:
   a substrate having a flat face;
   a bit line formed in a first direction on the substrate;
   a lower word line insulated from the bit line and formed in a second direction intersecting the first direction;
   a pad electrode electrically isolated from a sidewall of the lower word line and connected to the bit line;
   a cantilever electrode expending in the first direction, suspended over the lower word line with a lower void therebetween, and connected to the pad electrode, the cantilever electrode curved in a third direction that is vertical with respect to the first and second direction by an electrical field induced by a first charge applied to the lower word line;
   a trap site expending in the second direction and suspended over the cantilever electrode with an upper void therebetween; and
   an upper word line to which a charge to curve the cantilever electrode in a direction of the trap site is applied, the upper word line positioned on the trap site.

2. The device of claim 1, wherein the trap site comprises a first silicon oxide layer, trap silicon nitride layer and second silicon oxide layer.

3. The device of claim 1, further comprising an interlayer insulating film that is formed on a portion of the cantilever electrode overlapping the pad electrode to support the trap site and the upper word line.

4. A multibit electro-mechanical memory device, comprising:
   a substrate having a flat face;
   a bit line formed in a first direction on the substrate;
   a first interlayer insulating film on the bit line, and a trench formed in the first interlayer insulating film, the first interlayer insulating film formed in a second direction intersecting the first direction;
   first and second lower word lines formed on the first interlayer insulating film;
   a second interlayer insulating film that covers sides of the first and second lower word lines and sides of the first interlayer insulating film, wherein the first and second lower word lines are separated from each other by being on opposite sides of the trench;
   a pad electrode in a contact hole of which the bit line is exposed by removing a portion of the second interlayer insulating film provided on sides of the first and second lower word lines;
   first and second cantilever electrodes supported in the first direction by the pad electrode, the first and second cantilever electrodes above an upper part of the first and second lower word lines, and suspended above first and second lower voids, and separated by the trench, and curved in a third direction vertical to the first and second direction by an electrical field induced by a first charge applied to the first and second lower word lines;
   a third interlayer insulating film formed on the first and second cantilever electrodes corresponding to the pad electrode;
   first and second trap sites supported by the third interlayer insulating film and formed in the second direction, with first and second upper voids above an upper part of the first and second cantilever electrodes; and
   first and second upper word lines stacked on the first and second trap sites, to which a second charge is applied to curve the first and second cantilever electrodes in a direction of the first and second trap sites.

5. The device of claim 4, wherein the pad electrode is protruded more than a length of the second interlayer insulating film.

6. The device of claim 4, wherein the first and second trap sites have a stack structure of first silicon oxide layer, silicon nitride layer and second silicon oxide layer.

7. The device of claim 4, comprising a fourth interlayer insulating film formed to seal the trench at an upper part of the trench.

* * * * *